United States Patent
Takahashi et al.

(10) Patent No.: US 8,836,284 B2
(45) Date of Patent: Sep. 16, 2014

(54) DEVICE AND METHOD FOR CALCULATING VALUE OF RECHARGEABLE BATTERY

(75) Inventors: Kenji Takahashi, Toyota (JP); Nobuyasu Haga, Seto (JP); Shuji Tomura, Nagoya (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 129 days.

(21) Appl. No.: 13/698,584

(22) PCT Filed: May 17, 2010

(86) PCT No.: PCT/JP2010/058268
§ 371 (c)(1),
(2), (4) Date: Nov. 16, 2012

(87) PCT Pub. No.: WO2011/145161
PCT Pub. Date: Nov. 24, 2011

(65) Prior Publication Data
US 2013/0057291 A1  Mar. 7, 2013

(51) Int. Cl.
*H02J 7/14* (2006.01)
*H02J 7/00* (2006.01)
*H01M 10/54* (2006.01)
*G01R 31/36* (2006.01)
*H01M 2/10* (2006.01)
*H01M 10/48* (2006.01)

(52) U.S. Cl.
CPC ............ *H01M 2/1072* (2013.01); *H02J 7/0021* (2013.01); *H01M 10/54* (2013.01); *Y02E 60/12* (2013.01); *G01R 31/3662* (2013.01); *H01M 10/48* (2013.01)
USPC ........... 320/122; 320/134; 320/135; 320/104; 320/132; 324/426; 324/427; 324/430

(58) Field of Classification Search
CPC ..... H02J 7/0013; H02J 7/0016; H02J 7/0021; H02J 7/0054; H02J 7/0068; H02J 7/0022; H01M 222/00; H01M 2200/00; H01M 2220/20; H01M 2/10; H01M 2/1072; H01M 10/42; H01M 10/48; H01M 10/54; H01M 10/46; H01M 10/482; H01M 10/4207; H01M 10/425; G01R 31/36
USPC ......... 320/104, 110, 132, 112, 113, 114, 115, 320/116, 118, 122, 127, 137, 134, 136; 324/426, 427, 430
See application file for complete search history.

(56) References Cited

U.S. PATENT DOCUMENTS 6,072,300 A * 6/2000 Tsuji ............................. 320/116
7,362,074 B2 * 4/2008 Iwane et al. .................. 320/132
(Continued)

FOREIGN PATENT DOCUMENTS

JP  A-2006-12761   1/2006
JP  A-2006-197765  7/2006
(Continued)

*Primary Examiner* — Edward Tso
*Assistant Examiner* — Alexis Boateng
(74) *Attorney, Agent, or Firm* — Oliff PLC

(57) ABSTRACT

A rechargeable battery is used with a plurality of battery cells restrained by a restraint member. After the rechargeable battery has the restraint member removed therefrom and is thus disassembled when the rechargeable battery is subsequently re-restrained by the restraint member and thus reused an internal resistance measurement unit measures the rechargeable battery's internal resistance based on battery data detected after the rechargeable battery is re-restrained. At least for the internal voltage, from a value thereof as measured after the battery is re-restrained an evaluation unit evaluates a value of the rechargeable battery that is reused.

10 Claims, 13 Drawing Sheets

(56) References Cited

U.S. PATENT DOCUMENTS

| | | | |
|---|---|---|---|
| 7,626,364 B2 * | 12/2009 | Okumura et al. | 320/137 |
| 7,710,068 B2 * | 5/2010 | Tani et al. | 320/104 |
| 2005/0206388 A1 * | 9/2005 | Quint et al. | 324/430 |
| 2007/0108946 A1 * | 5/2007 | Yamauchi et al. | 320/132 |
| 2007/0134546 A1 * | 6/2007 | Hashimoto | 429/49 |
| 2010/0047684 A1 * | 2/2010 | Okumura et al. | 429/156 |
| 2010/0300601 A1 * | 12/2010 | Nakanishi et al. | 156/64 |
| 2011/0161025 A1 * | 6/2011 | Tomura et al. | 702/63 |

FOREIGN PATENT DOCUMENTS

| | | |
|---|---|---|
| JP | A-2007-141464 | 6/2007 |
| JP | A-2007-195312 | 8/2007 |
| JP | A-2008-293703 | 12/2008 |
| JP | A-2010-060384 | 3/2010 |
| JP | A-2010-066229 | 3/2010 |
| JP | A-2010-066232 | 3/2010 |
| JP | A-2010-086911 | 4/2010 |
| JP | A-2010-277873 | 12/2010 |

* cited by examiner

DEVICE AND METHOD FOR CALCULATING VALUE OF RECHARGEABLE BATTERY

TECHNICAL FIELD

The present invention relates to a device and method for calculating a value of a rechargeable battery and particularly to a technique that is used to calculate the price of a rechargeable battery that is used with a plurality of battery cells restrained by a restraint member after the battery is disassembled when it is reused.

BACKGROUND ART

In recent years, as represented by a rechargeable battery mounted in electric vehicles, hybrid vehicles and similar electrically powered vehicles, a battery pack having a plurality of battery cells packed therein is used to ensure necessary output voltage and accumulated electric power. Such a battery pack's price is relatively high, and accordingly, it is an important issue in terms of cost to reuse a battery. From a standpoint to promote reusing it, it is necessary to accurately calculate a value of a rechargeable battery that is reused to price it appropriately.

For example, Japanese Patent Laying-Open No. 2006-197765 (PTL 1) describes pricing a mobile object having incorporating therein an electric drive device represented by a rechargeable battery. According to PTL 2, an ECU (Electronic Control Unit) calculates and stores a degradation estimation parameter on board, as based on data of history of use of a main battery. Then, a degradation parameter is output from the ECU through a connector and a transmitter to a degradation estimation device outside a vehicle. The degradation estimation device estimates the battery's degraded state and expected lifetime based on the read degradation estimation parameter and therefrom calculates an appraised value of the rechargeable battery.

Furthermore, in general, a battery pack is configured of a plurality of battery cells restrained by a restraint member, as described in Japanese Patent Laying-Open No. 2006-012761 (PTL 2). The restraint member can also prevent increased internal pressure caused by gas generated in a battery cell. Furthermore, it can also prevent a battery cell and the battery pack from being varied in geometry and shape, respectively.

Japanese Patent Laying-Open No. 2007-195312 (PTL 3) describes a rechargeable battery lifetime estimation device for estimating an expected lifetime suitable for a rechargeable battery mounted on a vehicle. According to PTL 3, a correlation function is determined to have a value of a high correlation with the rechargeable battery's stored full charge capacity or internal resistance. The correlation function is defined as a linear function having a square root of a total distance travelled by a vehicle as a variable and is determined by using a least squares method or the like. Then, a point at which the determined correlation function intersects with a lifetime determination line is determined as a lifetime and a distance that is travelled before that lifetime is completely consumed is estimated as an expected lifetime.

CITATION LIST

Patent Literature

PTL 1: Japanese Patent Laying-Open No. 2006-197765
PTL 2: Japanese Patent Laying-Open No. 2006-012761
PTL 3: Japanese Patent Laying-Open No. 2007-195312

SUMMARY OF INVENTION

Technical Problem

When a set of a large number of battery cells, or a battery pack, is reused, it can have only a battery cell(s) that is/are degraded alone replaced to thereby replace a battery with a reduced cost. In doing so, it is necessary to once remove a restraint member and disassemble the battery pack. Then, after a battery cell is replaced with another, the battery pack is again restrained by the restraint member and a rechargeable battery is thus reused.

Thus disassembling and again restraining the battery pack, however, may change each battery cell's state. In particular, if the battery pack has battery cells in contact each other in a manner different than before resulting in each battery cell having a varied internal state, the battery pack's overall performance may vary depending on how it is re-restrained. As such, calculating the re-restrained battery pack's value only from the information of each battery cell that is obtained in a condition before disassembly or re-restraint may cause a large error.

The present invention has been made to overcome such a disadvantage, and an object of the present invention is to accurately calculate the performance and value of a rechargeable battery that is used with a plurality of battery cells restrained by a restraint member in reusing the rechargeable battery.

Solution to Problem

The present invention in one aspect provides a value calculation device for a rechargeable battery used with a plurality of battery cells restrained by a restraint member, the device including: a detector, a first measurement unit and an evaluation unit.

The detector is configured to detect battery data obtained as the rechargeable battery is electrically charged and discharged. The first measurement unit is configured to measure a battery parameter of the rechargeable battery after the rechargeable battery has the restraint member removed therefrom and is thus disassembled when the rechargeable battery is subsequently re-restrained by the restraint member and thus reused, the measuring being based on the battery data detected after the rechargeable battery is re-restrained. The evaluation unit is configured to evaluate from the battery parameter a value of the rechargeable battery reused. The battery parameter at least includes an internal resistance of the rechargeable battery.

Preferably, the value calculation device for a rechargeable battery further includes a second measurement unit configured to measure the battery parameter of one of the rechargeable battery and the battery cell before the rechargeable battery is re-restrained, the measuring being based on the battery data detected before the rechargeable battery is re-restrained. The battery parameter includes a first parameter measured by the first measurement unit and a second parameter measured by the second measurement unit. The first parameter includes the internal resistance and the second parameter includes a full charge capacity of the rechargeable battery.

Still preferably, the rechargeable battery is a rechargeable lithium ion battery. The first or second measurement unit includes a degradation parameter acquisition unit and a lithium deposition estimation unit. The degradation parameter acquisition unit is configured to be operative to perform a degradation diagnosis based on an open circuit voltage characteristic of the rechargeable lithium ion battery indicating how the rechargeable lithium ion battery varies in open circuit voltage as the rechargeable lithium ion battery varies in capacity to obtain a capacity ratio of a positive electrode of the rechargeable lithium ion battery, a capacity ratio of a negative electrode of the rechargeable lithium ion battery, and a battery capacity fluctuation amount. The lithium deposition estimation unit is configured to be operative to apply the capacity ratios respectively of the positive and negative electrodes that are obtained to a previously obtained correspondence between the capacity ratios respectively of the positive and negative electrodes and a first amount of the battery capacity fluctuation amount to separate the battery capacity fluctuation amount that is obtained into the first amount and a second amount of the battery capacity fluctuation amount, the first amount corresponding to degradation attributed to wear, the second amount corresponding to degradation attributed to deposition of lithium. The battery parameter, the first parameter or the second parameter includes the second amount.

The present invention in another aspect provides a value calculation method for a rechargeable battery used with a plurality of battery cells restrained by a restraint member, including the steps of: detecting battery data after the rechargeable battery has the restraint member removed therefrom and is thus disassembled when the rechargeable battery is subsequently re-restrained by the restraint member and thus reused, the battery data being detected as the rechargeable battery is electrically charged and discharged; measuring a battery parameter of the rechargeable battery after the rechargeable battery is re-restrained, the measuring being based on the battery data detected after the rechargeable battery is re-restrained; and evaluating a value of the rechargeable battery reused, the evaluating being based on the battery parameter measured in the step of measuring. The battery parameter at least includes an internal resistance of the rechargeable battery.

Preferably, the value calculation method for a rechargeable battery further includes the step of measuring the battery parameter of one of the rechargeable battery and the battery cell before the rechargeable battery is re-restrained, the measuring being based on the battery data detected before the rechargeable battery is re-restrained. The battery parameter includes a first parameter measured in the step of measuring after the rechargeable battery is re-restrained and a second parameter measured in the step of measuring before the rechargeable battery is re-restrained. The first parameter includes the internal resistance and the second parameter includes a full charge capacity of the rechargeable battery.

Still preferably, the rechargeable battery is a rechargeable lithium ion battery. the step of measuring after the rechargeable battery is re-restrained or the step of measuring before the rechargeable battery is re-restrained includes the steps of: performing a degradation diagnosis based on an open circuit voltage characteristic of the rechargeable lithium ion battery indicating how the rechargeable lithium ion battery varies in open circuit voltage as the rechargeable lithium ion battery varies in capacity to obtain a capacity ratio of a positive electrode of the rechargeable lithium ion battery, a capacity ratio of a negative electrode of the rechargeable lithium ion battery, and a battery capacity fluctuation amount; and applying the capacity ratios respectively of the positive and negative electrodes that are obtained to a previously obtained correspondence between the capacity ratios respectively of the positive and negative electrodes and a first amount of the battery capacity fluctuation amount to separate the battery capacity fluctuation amount that is obtained into the first amount and a second amount of the battery capacity fluctuation amount, the first amount corresponding to degradation attributed to wear, the second amount corresponding to degradation attributed to deposition of lithium. The battery parameter, the first parameter or the second parameter includes the second amount.

Advantageous Effects of Invention

The present invention thus allows accurate calculation of the performance and value of a rechargeable battery that is used with a plurality of battery cells restrained by a restraint member in reusing the rechargeable battery.

BRIEF DESCRIPTION OF DRAWINGS

FIG. 16 represents a relationship between positive and negative electrodes' capacity ratios and a deviated capacity of a correspondence in composition between the electrodes when degradation attributed to wear is alone caused.

DESCRIPTION OF EMBODIMENTS

Hereinafter reference will be made to the drawings to describe the present invention in embodiments. In the figures, identical or corresponding components are identically denoted and will not be described repeatedly in principle.

First Embodiment

Figure 1:
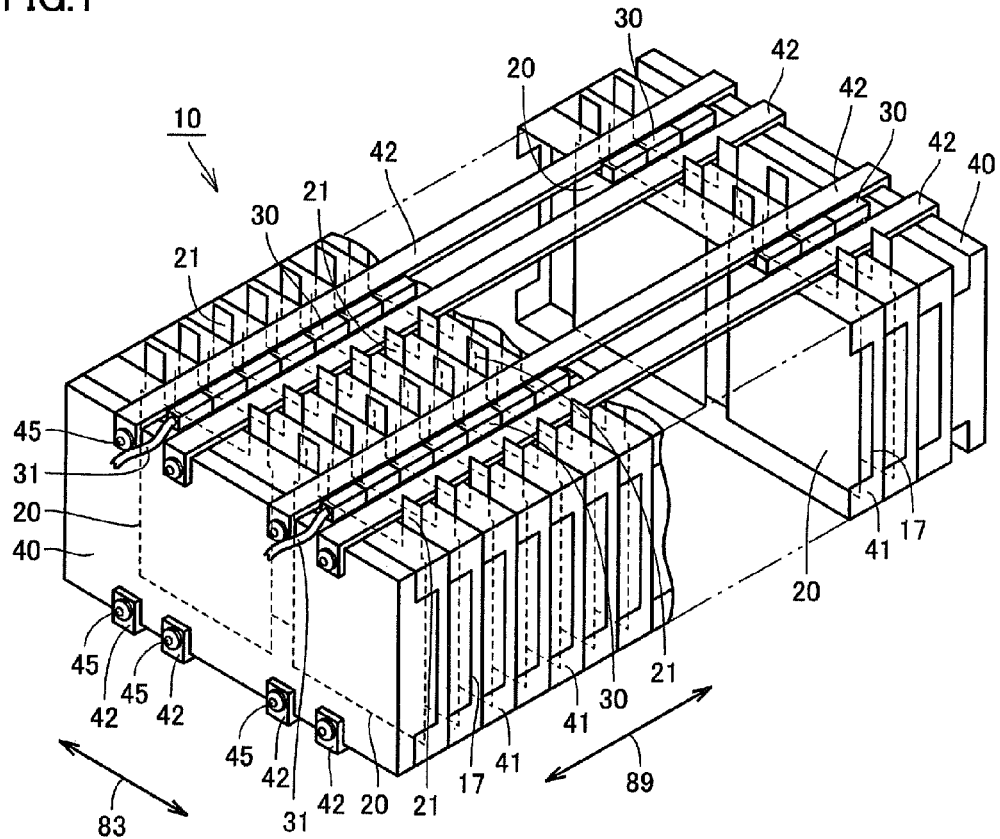
FIG. 1 is a general perspective view showing an example in configuration of a battery pack to which a technique of calculating a value of a rechargeable battery is applied in an embodiment of the present invention.

FIG. 1 is a general perspective view showing an example in configuration of a battery module 10 implementing a battery pack to which a technique of calculating a value of a rechargeable battery is applied according to an embodiment of the present invention.

With reference to FIG. 1, battery module 10 includes a plurality of battery cells 20. The plurality of battery cells 20 is stacked in the direction of their thickness. An arrow 89 represents the direction. In the example of FIG. 1, battery module 10 is configured with battery cells 20 stacked in two rows.

Battery module 10 is mounted in a hybrid vehicle, an electric vehicle, or a similar electrically powered vehicle, for example. Battery module 10 is mounted in an electrically powered vehicle with an arrow 83 indicating a horizontal direction. Furthermore, a plurality of battery modules 10 may be packed together to configure a battery pack.

Battery module 10 includes a frame member for holding battery cells 20. The frame member includes an end plate 40 and a battery holder 41. The stack includes battery cell 20 and battery holder 41. In the present embodiment the stack has battery cell 20 and battery holder 41 disposed alternately in a direction in which battery cells 20 are stacked.

Battery holder 41 is disposed between adjacent battery cells 20 in the direction in which battery cells 20 are stacked. One battery cell 20 is held by two battery holders 41 disposed at the opposite sides of that battery cell 20. Between opposite battery holders 41, as seen in a plane, a plurality of battery cells 20 are disposed in a direction perpendicular to the direction in which battery cells 20 are stacked. In the present embodiment, two battery cells 20 are disposed in the direction perpendicular to the direction in which battery cells 20 are stacked.

In the example of FIG. 1, battery cell 20 is a square battery cell. Battery cell 20 is configured of a rechargeable nickel metal hydride battery, a rechargeable lithium ion battery or the like. Battery cell 20 has an electrode 21. Electrode 21 is provided in the form of a plate. Electrode 21 is formed to project from an end face of battery cell 20. Battery holder 41 is formed to allow electrode 21 to be exposed between adjacent battery holders 41. The plurality of battery cells 20 have their electrodes 21 electrically interconnected by a bus bar (not shown).

Battery holder 41 is formed of an electrically insulating material. Battery holder 41 electrically insulates battery cells 20 that are adjacent in the direction in which battery cells 20 are stacked. In the present embodiment battery holder 41 is formed of resin. Battery holder 41 is formed of polyethylene (PE), polypropylene (PP), a polymer of polypropylene, nylon, polybutylene terephthalate (PBT), or a similar resin material, for example.

End plate 40 is disposed at the opposite sides of the stack as seen in the direction in which the battery cells are stacked. In the present embodiment end plate 40 is formed in a plate. In the present embodiment end plate 40 is formed of resin. End plate 40 is disposed to sandwich the stack of battery cell 20 and battery holder 41 at the opposite sides as seen in the direction in which the battery cells are stacked.

Battery module 10 includes a restraint band 42 as a "restraint member." For example, restraint band 42 is in the form of a plate. Restraint band 42 is formed to have a longitudinal direction. Restraint band 42 is disposed so that the longitudinal direction extends in the direction in which battery cells 20 are stacked.

Restraint band 42 is disposed to fasten end plates 40 to each other. Restraint band 42 is fastened to end plate 40 with a rivet 45 serving as a fastening member. Restraint band 42 is disposed to restrain battery cells 20 in the direction in which battery cells 20 are stacked. A plurality of battery holders 41 and a plurality of battery cells 20 are held together by restraint band 42.

Restraint band 42 is disposed at a region of each row of battery cells 20. Restraint band 42 is disposed to fix each row of battery cells 20. Preferably, a plurality of restraint bands 42 are disposed for each row of battery cells 20 for firm restraint.

Battery holder 41 has an emission gas flow path unit 30. Emission gas flow path unit 30 configures an emission gas flow path to pass gas discharged from battery cell 20. Emission gas flow path unit 30 is internally hollowed. Emission gas flow path unit 30 has an end with an exhaust tube 31 connected thereto.

Battery holder 41 has an opening 17. Opening 17 is formed by notching a side surface of battery holder 41. Battery cell 20 is cooled by air serving as a fluid which passes through opening 17.

Thus, battery module 10 is used in such a condition that it is restrained by restraint band 42. Battery module 10 undergoes a degradation diagnosis and therefrom whether it should be replaced is determined on board or off board.

Figure 2:
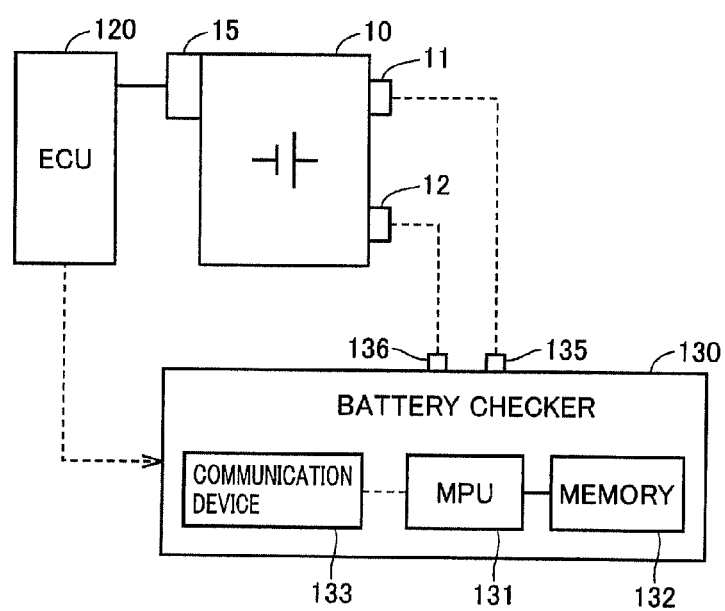
FIG. 2 is a block diagram showing a configuration for evaluating in performance and value the battery module shown in FIG. 1.

FIG. 2 is a block diagram showing a configuration for evaluating the FIG. 1 battery module in performance and value.

With reference to FIG. 2, battery module 10 is provided with a battery sensor 15. Battery sensor 15 generically indicates a voltage sensor, a current sensor, and a temperature sensor, for example, and it is configured to sense the voltage, current, and temperature of battery module 10. Alternatively, battery module 10 may have its constituent battery cells 20 divided into a plurality of battery blocks and its voltage, current, and temperature may be sensed for each battery block. Note that, hereinafter, values of voltage, current, and temperature sensed will also collectively be referred to as "battery data".

ECU 120 is configured to monitor and control a state of charge of battery module 10 on board, based on the battery data sensed by battery sensor 15 when the battery module is in use. For example ECU 120 estimates a state of charge (typically, an SOC that is represented by a ratio of a currently available capacity to a full charge capacity) of battery module 10 on board. Alternatively, ECU 120 may set an upper limit for electric power to be charged/discharged based on an estimated SOC, the battery data and the like, as occasion requires.

Furthermore, while battery module 10 is in use, i.e., on board, ECU 120 can concurrently calculate a battery parameter which can be used for evaluating battery module 10 in performance. For example, internal resistance, full charge capacity, and the like can be calculated on board as the battery parameter, as indicated in Japanese Patent Laying-Open No. 2007-195312 (PTL 3). This battery parameter is also used for degradation diagnosis.

Battery checker 130 includes a microprocessing unit (MPU) 131, a memory 132, a communication device 133, and test terminals 135 and 136.

Communication device 133 is configured to be capable of wired and/or wireless data communication with ECU 120. MPU 131 can read a program, data, and the like previously stored in memory 132 to perform a predetermined controlling process accompanied by an operation.

Test terminals 135 and 136 are electrically connectable to battery module 10 or battery cell 20 at a positive electrode terminal 11 and a negative electrode terminal 12, respectively. In other words, connecting positive electrode terminal 11 and negative electrode terminal 12 to test terminals 135 and 136, respectively, allows battery checker 130 to evaluate the performance of battery module 10 or battery cell 20. Specifically, battery checker 130 can measure the battery parameter of battery module 10 or battery cell 20 in accordance with a procedure previously stored as a program.

Figure 3:
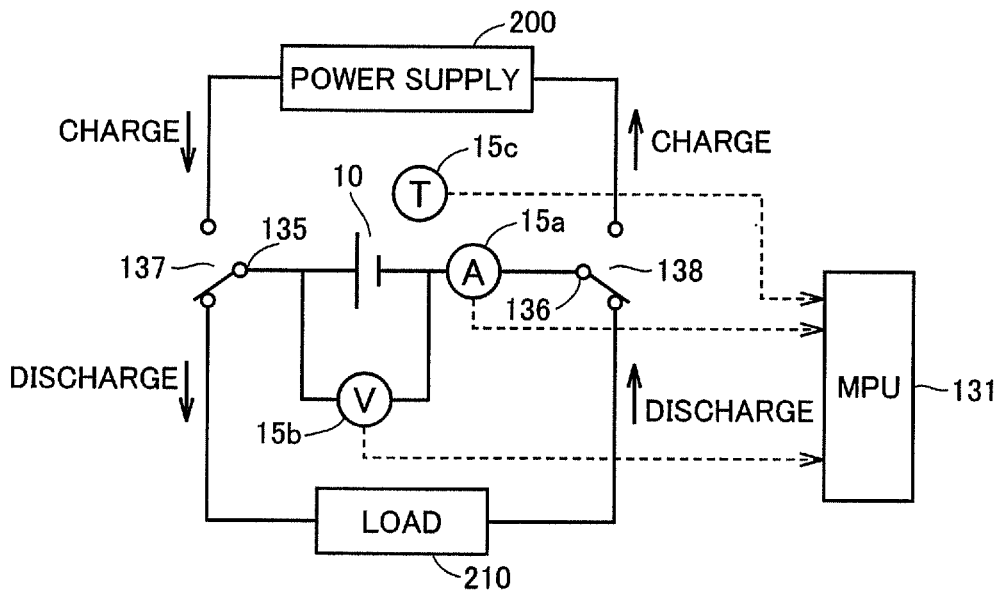
FIG. 3 is a block diagram showing a configuration for measuring a battery parameter of the FIG. 1 battery module or battery cell by a battery checker off board.

FIG. 3 shows a configuration for measuring the battery parameter of battery module 10 or battery cell 20 by battery checker 130 off board.

With reference to FIG. 3, battery module 10 or battery cell 20 has positive and negative electrodes electrically connected to battery checker 130 at test terminals 135 and 136 via terminals 11 and 12 shown in FIG. 2.

As a result, battery module 10 or battery cell 20 is connected to a power supply 200 and a load 210 via switches 137 and 138. Load 210 receives electric power discharged from battery module 10 or battery cell 20. Furthermore, power supply 200 supplies electric power charged to battery module 10 or battery cell 20. MPU 131 is operable to control switches 137, 138 to control electric power charged to and discharged from battery module 10 or battery cell 20.

Note that while the FIG. 3 system is configured such that battery module 10 or battery cell 20 is connected to load 210 and power supply 200 as switches 137 and 138 are switched on/off as controlled, the FIG. 3 configuration is not the only configuration to measure the battery parameter off board. That is, any configuration is applicable that can electrically charge and discharge battery module 10 or battery cell 20, as intended.

Current sensor 15a, voltage sensor 15b, and temperature sensor 15c sense the battery data of battery module 10 or battery cell 20. The sensed battery data is output to MPU 131. Current sensor 15a, voltage sensor 15b, and temperature sensor 15c may use battery sensor 15 shown in FIG. 2. In other words, battery sensor 15, or current sensor 15a, voltage sensor 15b and temperature sensor 15c, configure a "detector".

Based on the battery data, for example, full charge capacity (see FIG. 4), internal resistance (see FIG. 5) and the like are measured as a battery parameter.

Figure 4:
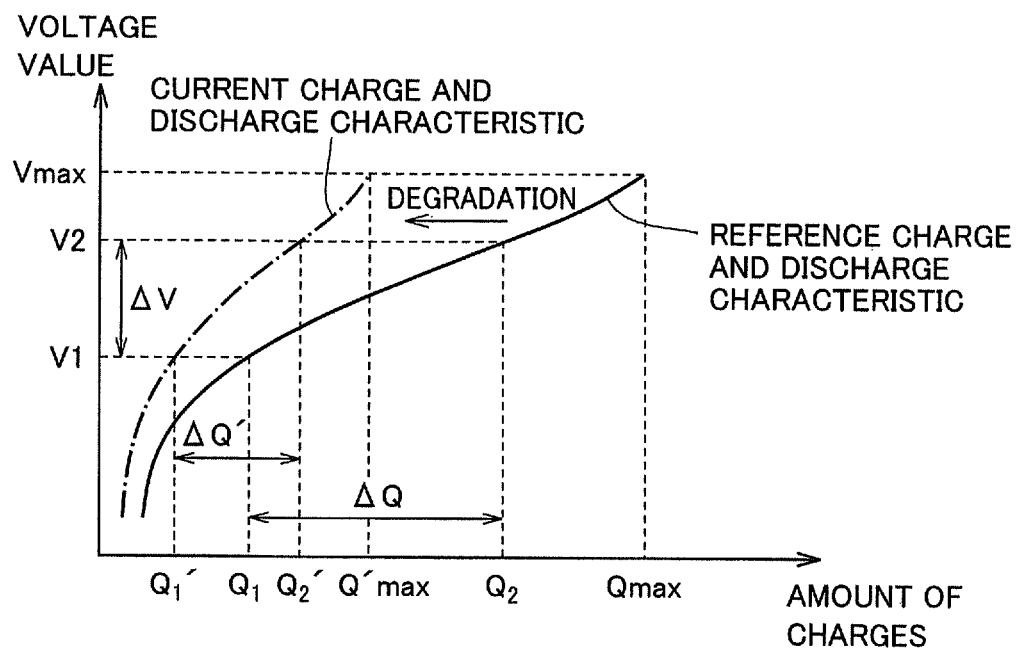
FIG. 4 represents a concept for illustrating how a rechargeable battery's full charge capacity degrades.

Referring to FIG. 4, a rechargeable battery (battery module 10 or battery cell 20) has a reference charge and discharge characteristic, as indicated by a solid line, stored in battery checker 130 or ECU 120. This reference charge and discharge characteristic represents a relationship between an amount of charges of the rechargeable battery in a reference state and a value in voltage (or open circuit voltage) thereof. In the reference charge and discharge characteristic, an amount of charges $Q_{max}$ corresponding to a maximum voltage value $V_{max}$ corresponds to the "full charge capacity" in the reference state. The reference charge and discharge characteristic can be measured experimentally in advance.

As the rechargeable battery degrades, the reference charge and discharge characteristic shown in FIG. 4 is "shrunk" along the axis of abscissas. FIG. 4 shows one example of a current charge and discharge characteristic, as indicated by a chain dotted line, of the rechargeable battery when it is degraded to some extent. In the current charge and discharge characteristic, as degradation proceeds, an amount of charges charged for which maximum voltage value $V_{max}$ is attained, that is, which corresponds to the full charge capacity, is decreased to $Q'_{max}$. How the amount of charges varies can be calculated by integrating a battery current Ib.

Accordingly, such a detected value that a full charge capacity at the current time point is $Q'_{max}$ can be employed as a battery parameter. It is noted that how the full charge capacity varies can be found without necessarily setting the rechargeable battery in a fully charged state.

As shown in FIG. 4, when the rechargeable battery has a value in voltage increased from V1 to V2, it is charged with an amount of charges $\Delta Q$ (=Q2−Q1) in the reference charge and discharge characteristic, whereas it is charged with an amount of charges $\Delta Q'$ (=Q2'−Q1') in the current charge and discharge characteristic. Here, the current charge and discharge characteristic can be regarded as the reference charge and discharge characteristic that is entirely shrunk at a prescribed ratio along the axis of abscissas (or the axis representing the amount of charges). In other words, a relational expression of $\Delta Q : \Delta Q' = \Delta Q_{max} : \Delta Q'_{max}$ is established. Consequently, ECU 100 can derive a full charge capacity as $Q'_{max} = \Delta Q_{max} \times \Delta Q' / \Delta Q$ in accordance with the above relational expression by calculating $\Delta Q'$ by integrating battery current 1b.

Figure 5:
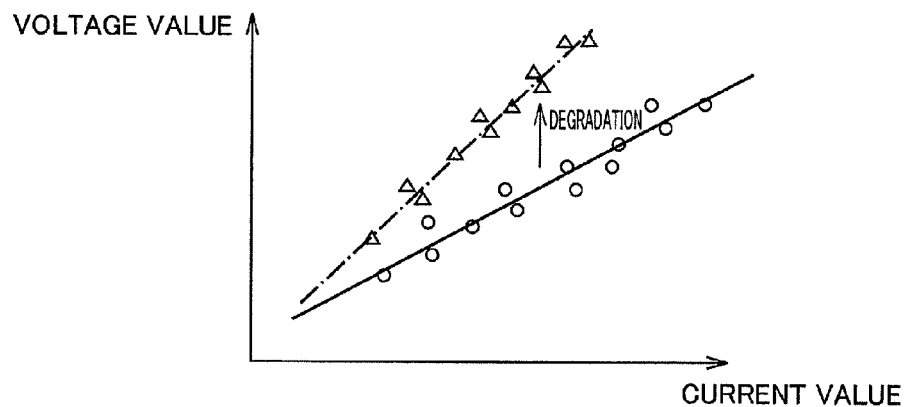
FIG. 5 represents a concept for illustrating how a rechargeable battery's internal resistance degrades.

Referring to FIG. 5, the rechargeable battery has an internal resistance attributed to a material for a positive electrode, a material for a negative electrode, an electrolyte (an electrolytic solution), and the like. The internal resistance increases as the rechargeable battery degrades. The internal resistance value can be derived from a voltage value and a current value detected in a period of time for which the rechargeable battery has a current (a charging current or a load current) passing therethrough. Specifically, the internal resistance value can be derived based on a ratio of a voltage drop caused as the rechargeable battery (battery module 10 or battery cell 20) has a current passing therethrough and the value of the current corresponding to the voltage drop.

Battery checker 130 or ECU 120 obtains a battery voltage Vb (a voltage value) and battery current Ib (a current value) of the battery data in a period of time for which battery module 10 or battery cell 20 has a current passing therethrough. After battery voltage Vb and battery current Ib are obtained a plurality of times, a linear function for the current value is derived such that their correlation value is maximized. The derived linear function has a slope, which corresponds to the internal resistance value. As the battery degrades, the internal resistance value increases. Therefore, as shown in FIG. 5, the slope of the linear function becomes steeper.

The above described full charge capacity and internal resistance can also be measured by ECU 120 when battery module 10 is in use. Accordingly, battery checker 130 can also communicate with ECU 120 via communication device 133 to read from ECU 120 a battery parameter measured by ECU 120 on board when battery module 10 is in use.

Whether battery module 10 should be replaced is determined by a degradation diagnosis based on the battery parameter. Alternatively, it may simply be determined from how long the module is used or the like.

Once it has been determined that battery module 10 requires replacement, it is removed from a device and thereafter reused. As a manner of reuse, in the present embodiment, a plurality of battery cells 20 have rather degraded one(s) alone replaced and subsequently battery module 10 is reused.

More specifically, battery module 10 has restraint band 42 removed therefrom and is thus disassembled. Then, after the plurality of battery cells 20 has a portion thereof replaced, battery module 10 is again restrained by restraint band 42. Then, battery module 10 re-restrained is again attached to the device.

For reuse of the rechargeable battery, it is necessary to calculate the value of battery module 10 accurately. An accurately calculated value allows battery module 10 that is reused to be priced appropriately, and reusing it can be smoothly promoted.

The above described battery parameter can also be measured before battery module 10 is disassembled. When battery module 10 is in use or before it is disassembled, the battery parameter can be measured for each unit for which the battery data (voltage and temperature, in particular) can individually be detected (for example, the battery block described above). Furthermore, the battery parameter can also be obtained for each battery cell 20 by using battery checker 130 after battery module 10 is disassembled. Furthermore, a battery parameter of a replacement battery cell 20 can also be measured in advance by battery checker 130.

Accordingly, a value of a set of battery parameters measured before re-restraining battery module 10 can also be calculated as an overall battery parameter of battery module 10 that is reused, and the calculated battery parameter can be used to calculate its value.

However, as battery module 10 undergoes disassembly and re-restraint, it may have a battery parameter, internal resistance in particular, significantly varied between before re-restraint (including before disassembly and in-use) and after re-restraint. This is because each used battery cell 20 has generated gas and thus has internal pressure caused therein and battery cells 20 thus contact each other in a condition different than before and thus each have a varied internal state. In particular, when the distance between the polar plates is varied, there is a large possibility that the internal resistance will vary. In contrast, it is expected that each battery cell 20 has full charge capacity with less variation between before and after re-restraint than it has internal resistance.

Accordingly, in the present embodiment, calculating a value of a rechargeable battery includes measuring at least a portion of a battery parameter of battery module 10 that is reused after it is re-restrained.

Figure 6:
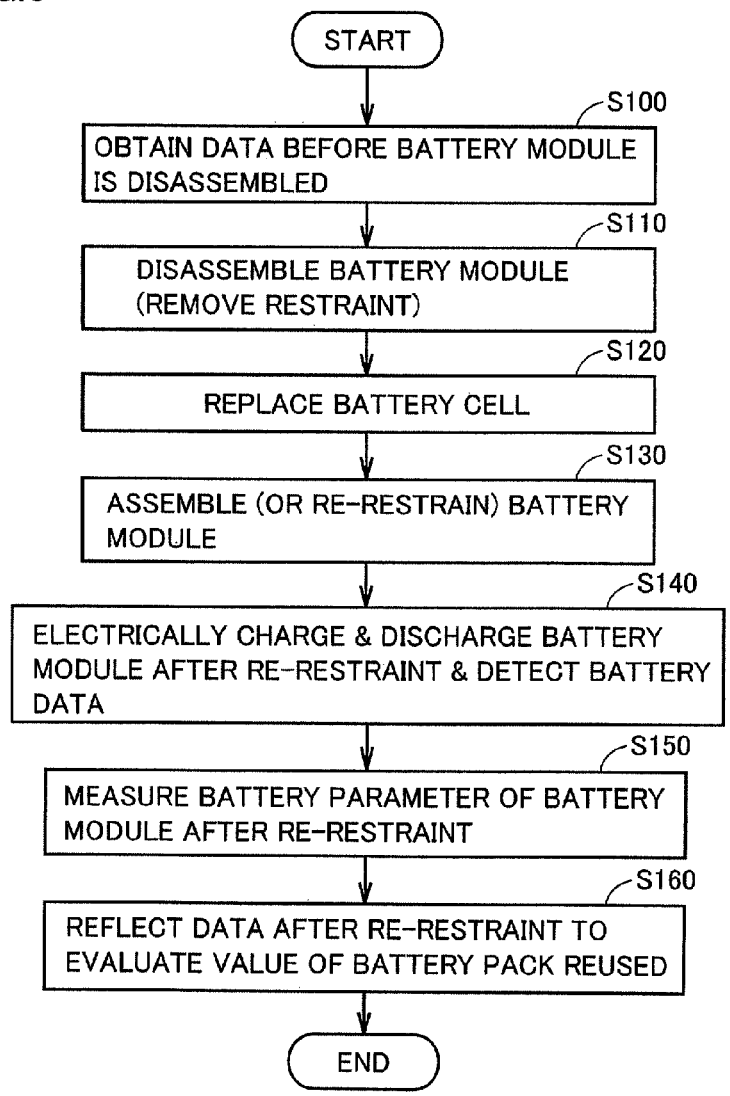
FIG. 6 is a flowchart representing a procedure of a process of a method for calculating a value of a rechargeable battery according to an embodiment of the present invention.

FIG. 6 is a flowchart representing a procedure of a process of a method for calculating a value of a rechargeable battery according to an embodiment of the present invention.

With reference to FIG. 6, battery checker 130 at Step S100 measures a battery parameter of battery module 10 before disassembly. Alternatively, at Step S100, battery checker 130 may not measure the battery parameter directly, and may instead read from ECU 120 a battery parameter measured on board when battery module 10 is in use.

At Step S110, the restraint member is removed to disassemble battery module 10. Battery module 10 can thus be replaced cell by cell.

Then, at Step S120, battery cells 20 have rather degraded one(s) replaced. Which battery cell requires replacement is determined based for example on the battery parameter obtained at Step S100. Alternatively, which battery cell requires replacement may not be determined based on the battery parameter; rather, it may be determined in accordance with a diagnostic code or the like generated when battery module 10 is in use.

Note that Steps S100 and S110 may be switched with each other to measure a battery parameter of each battery cell 20 after disassembly. In that case, which battery cell requires replacement can be determined based on the battery parameter measured after disassembly. Thus, step S100 is performed to calculate before re-restraint a battery parameter of battery module 10 or battery cell 20 that is reused. As described above, the measurement before re-restraint also includes measurement done when battery module 10 is in use (on board).

At Step S130, all battery cells 20 including the replacement battery cell(s) are restrained by the restraint member to assemble battery module 10. Thereby, battery module 10 is re-restrained.

Furthermore, battery checker 130 at Step S140 detects the battery data of battery module 10 after re-restraint in a charging and discharging test or the like shown in FIG. 3. Then, battery checker 130 at Step S150 measures a battery parameter after re-restraint, based on the battery data detected at Step S140. The battery parameter measured at Step S140 at least includes internal resistance.

Then, battery checker 130 at Step S160 reflects the battery parameter after re-restraint to evaluate a value of battery module 10 that is reused.

Figure 7:
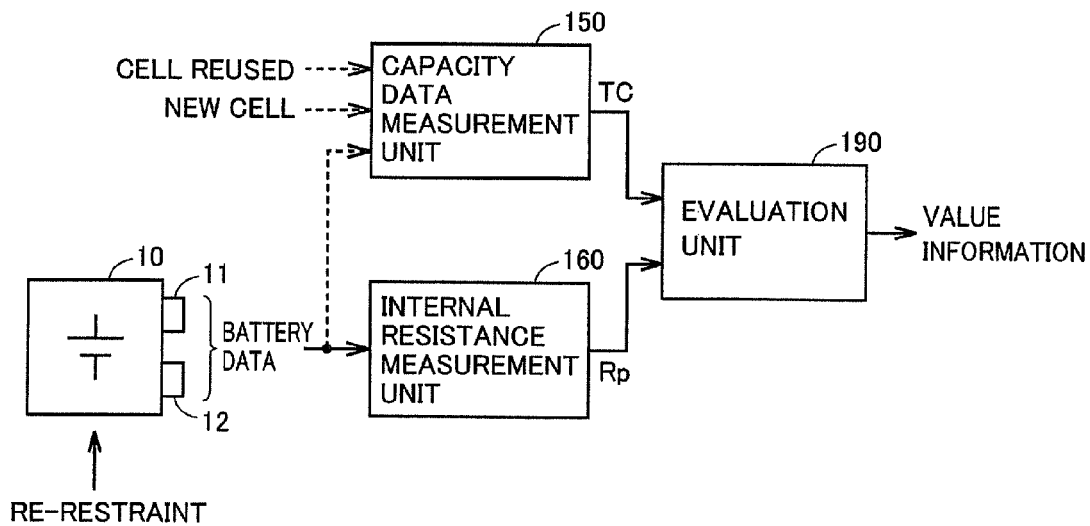
FIG. 7 is a functional block diagram for illustrating a configuration of a device that calculates a value of a rechargeable battery according to a first embodiment of the present invention.

FIG. 7 is a functional block diagram for illustrating a configuration of a device that calculates a value of a rechargeable battery according to the first embodiment of the present invention. FIG. 7 shows functional blocks, which can be implemented for example by MPU 131 performing a predetermined program.

With reference to FIG. 7, a capacity data measurement unit 150 measures a full charge capacity TC of battery module 10. Full charge capacity TC may be measured either before or after re-restraint. For example, if the full charge capacity is measured before re-restraint to determine which to be replaced, the measured value can exactly be used. In other words, full charge capacity TC can also be obtained in accordance with the total of the full charge capacities of reused battery cell(s) 20 and replacement battery cell(s) 20.

Capacity data measurement unit 150 corresponds to a "first measurement unit" if it measures the full charge capacity after re-restraint, and capacity data measurement unit 150 corresponds to a "second measurement unit" if it measures the full charge capacity before re-restraint.

An internal resistance measurement unit 160 measures internal resistance Rp after re-restraint, based on the battery data obtained when battery module 10 re-restrained is electrically charged or discharged. As described above, internal resistance should be measured after re-restraint, and accordingly, internal resistance measurement unit 160 corresponds to the "first measurement unit".

An evaluation unit 190 generates value information of battery module 10 that is re-restrained and reused from internal resistance Rp and full charge capacity TC as measured. The value information includes a period of time for which battery module 10 is reusable, price information set to correspond to the period, and the like set based on the internal resistance and the full charge capacity.

Thus the present invention in the first embodiment allows a battery parameter of a battery module disassembled and re-restrained and thereafter reused to be accurately obtained to accurately calculate its value. In particular, it can also prevent the value of battery module 10 reused from being miscalculated if battery cells 20 are restrained in a condition different than before and thus have internal resistance significantly varied between before and after re-restraint.

Furthermore, excluding a battery parameter other than internal resistance from those to be measured after re-restraint can reduce a period of time required to calculate the value of battery module 10 reused.

Second Embodiment

Rechargeable lithium ion battery is increasingly used for its advantageously high output voltage and high power density. On the other hand, it is known that whether a rechargeable lithium ion battery degrades is significantly affected by deposition of metallic lithium. Accordingly, preferably, how much the rechargeable lithium ion battery is degraded is evaluated based on deposition of lithium evaluated quantitatively.

System Configuration

In a second embodiment will be described a method employed to quantitatively estimate an amount of lithium deposited in a rechargeable lithium ion battery, and a technique employed to calculate a value of a rechargeable battery that is reused from the amount of lithium deposited as estimated. In other words, in the second embodiment, each battery cell 20 that configures battery module 10 is a rechargeable lithium ion battery.

Figure 8:
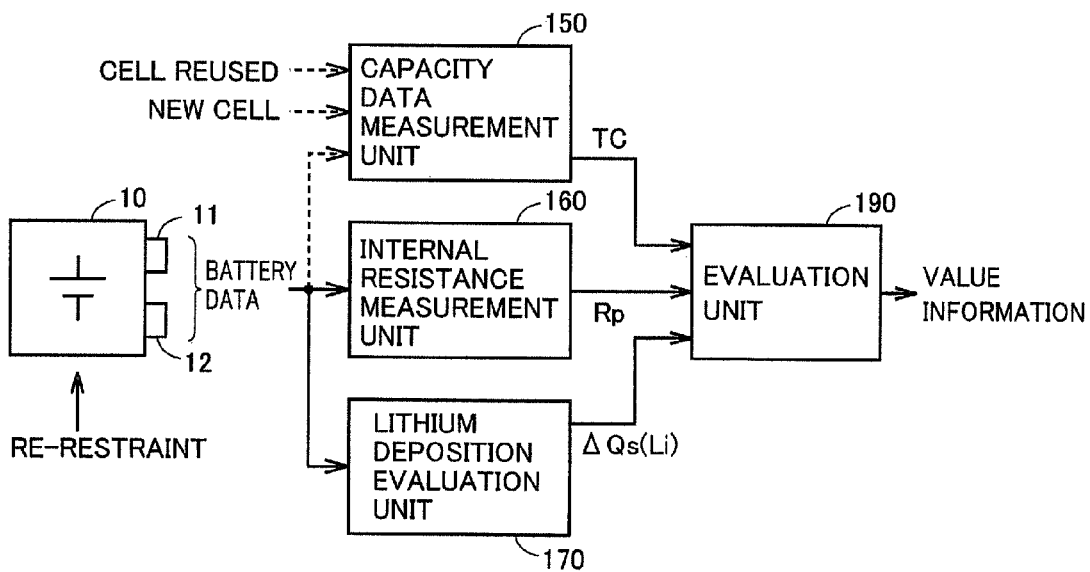
FIG. 8 is a functional block diagram for illustrating a configuration of a device that calculates a value of a rechargeable battery according to a second embodiment of the present invention.

FIG. 8 is a functional block diagram for illustrating a configuration of a device that calculates a value of a rechargeable battery according to the second embodiment of the present invention.

With reference to FIG. 8, the second embodiment provides a device that calculates a value of a rechargeable battery, that has the configuration described in the first embodiment and shown in FIG. 7 plus a lithium deposition measurement unit 170. Evaluation unit 190 uses full charge capacity TC, internal resistance Rp, and, in addition, a parameter $\Delta Qs(Li)$ representing an amount of lithium deposited to generate value information of battery module 10 reused.

Extracting Amount of Lithium Deposited

In the second embodiment each battery module 10 (or each battery block) or each battery cell 20 undergoes a degradation diagnosis to calculate a positive electrode's capacity ratio k1, a negative electrode's capacity ratio k2, and a battery capacity fluctuation amount (a deviated capacity) $\Delta Qs$.

The positive electrode's capacity ratio k1 is defined by a ratio of the positive electrode's capacity in a degraded state to that in an initial state. The negative electrode's capacity ratio k2 is defined by a ratio of the negative electrode's capacity in the degraded state to that in the initial state. The deviated capacity is a deviated capacity of a correspondence in composition between the positive and negative electrodes, and corresponds to the "battery capacity fluctuation amount". Hereinafter, these degradation parameters will be described in detail.

As is well known, a rechargeable lithium ion battery includes a negative electrode, a separator including an electrolyte, and a positive electrode (not shown). The negative electrode and the positive electrode are each configured of an aggregate of spheres of an active material. When the rechargeable lithium ion battery electrically discharges, a chemical reaction is caused on an interface of the active material of the negative electrode to discharge lithium ions Li+ and electrons e−. On the other hand, a chemical reaction is caused on an interface of the active material of the positive electrode to absorb lithium ions Li+ and electrons e−. When the rechargeable lithium ion battery is electrically charged, a reaction opposite to the above reaction is caused.

The negative electrode is provided with a current collector plate which absorbs electrons, and the positive electrode is provided with a current collector plate which discharges electrons. The current collector plate of the negative electrode is formed for example of copper and connected to a negative electrode terminal. The current collector plate of the positive electrode is formed for example of aluminum and connected to a positive electrode terminal. Lithium ions are provided and received between the positive electrode and the negative electrode via the separator to electrically charge/discharge the rechargeable lithium ion battery.

Note that the rechargeable lithium ion battery internally has a state of charge varying with a lithium concentration profile in the active material of each of the positive and negative electrodes. This lithium contributes to a reaction of the rechargeable lithium ion battery.

The rechargeable lithium ion battery outputs voltage V, which is represented by the following expression (1):

$$V = OCV(\theta_1, \theta_2) - R \times I \qquad (1)$$

where OCV represents the rechargeable lithium ion battery's open circuit voltage, R represents the rechargeable lithium ion battery's overall resistance, and I represents a current that flows through the rechargeable lithium ion battery. Resistance R includes pure electric resistance against electron transfer at the negative and positive electrodes, and charge-transfer resistance acting equivalently as electric resistance when a reaction current is generated at an interface of the active material.

$\theta_1$ is a local state of charge (SOC) obtained at a surface of the active material of the positive electrode, and $\theta_2$ is a local SOC obtained at a surface of the active material of the negative electrode. Resistance R has a characteristic which varies with $\theta_1$, $\theta_2$, and the battery's temperature. In other words, resistance R can be represented as a function of $\theta_1$, $\theta_2$, and the battery's temperature.

Local SOCs $\theta_1$ and $\theta_2$ are represented by the following expression (2):

$$\theta_i = Cs_{e,i}/Cs_{,i,\max} (i=1,2) \qquad (2)$$

where Cse, i represents a lithium concentration (as averaged) at an interface of the active material (of the positive or negative electrode), and Cs, i, max represents a limit lithium concentration in the active material (of the positive or negative electrode). The limit lithium concentration is an upper limit value of a lithium concentration in the positive/negative electrodes.

Figure 9:
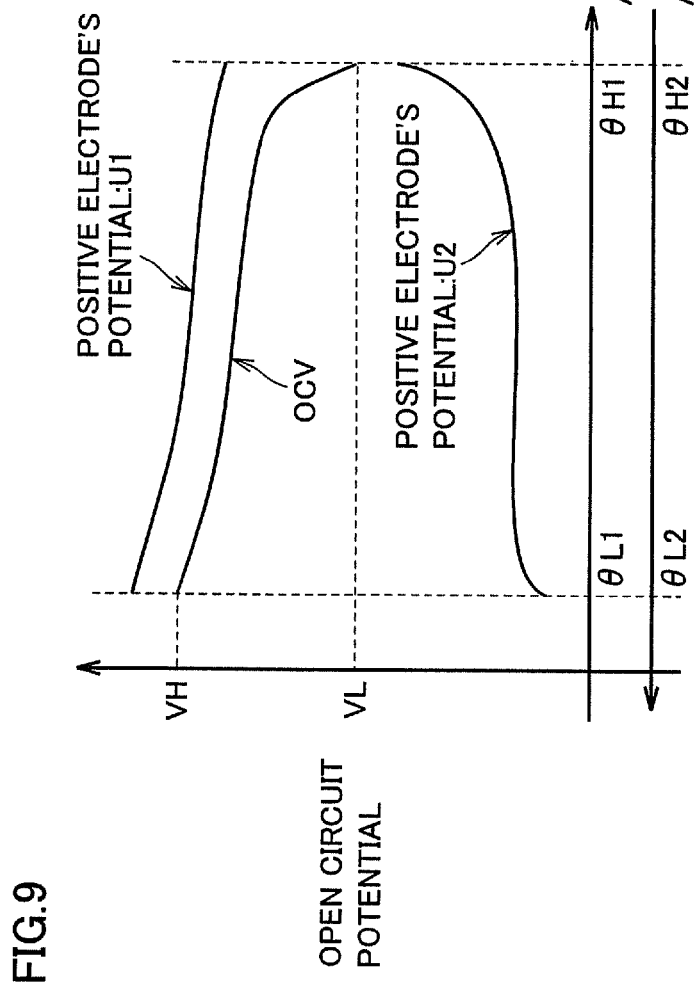
FIG. 9 conceptually represents a characteristic of how open circuit voltage varies as local SOC varies.

FIG. 9 conceptually represents a characteristic of how open circuit voltage varies as local SOC varies.

With reference to FIG. 9, the rechargeable lithium ion battery has open circuit voltage OCV represented as a difference in potential between the positive electrode's open circuit potential U1 and the negative electrode's open circuit potential U2. The positive electrode's open circuit potential U1 has a characteristic varying with local SOC $\theta_1$ obtained at a surface of the active material of the positive electrode, and the negative electrode's open circuit potential U2 has a characteristic varying with local SOC $\theta_2$ obtained at a surface of the active material of the negative electrode.

Measuring a relationship between local SOC $\theta_1$ and the positive electrode's open circuit potential U1 when the rechargeable lithium ion battery is in an initial state allows a characteristic to be obtained that represents the relationship between local SOC θ1 and the positive electrode's open circuit potential U1 (i.e., a curve for U1 represented in FIG. 9). The initial state means a state in which the rechargeable lithium ion battery is not degraded, and for example means a state of the rechargeable lithium ion battery immediately after the battery is produced.

Measuring a relationship between local SOC θ2 and the negative electrode's open circuit potential U2 when the rechargeable lithium ion battery is in the initial state allows a characteristic to be obtained that represents the relationship between local SOC θ2 and the negative electrode's open circuit potential U2 (i.e., a curve for U2 represented in FIG. 9). Data representing these characteristics (U1, U2) can previously be stored in a memory in the form of a map.

The rechargeable lithium ion battery's open circuit voltage OCV has a characteristic decreasing as the battery is electrically discharged. Furthermore, the rechargeable lithium ion battery in a degraded state has voltage decreased in a larger amount than in the initial state for the same electrically discharging period of time. This indicates that as the rechargeable lithium ion battery degrades, its full charge capacity has decreased and its open circuit voltage characteristic has varied.

In the present embodiment, how the rechargeable lithium ion battery's open circuit voltage characteristic varies as the rechargeable lithium ion battery degrades is modeled by two phenomena believed to occur in the rechargeable lithium ion battery in a degraded state. These two phenomena are reduction in a single electrode's capacity at the positive and negative electrodes, and a deviation of a correspondence in composition between the positive and negative electrodes.

Reduction in a single electrode's capacity represents reduction in an ability of each of the positive and negative electrodes to accept lithium. A reduced ability to accept lithium means that the active material and the like that function effectively for electrically charging/discharging the battery is reduced.

Figure 10:
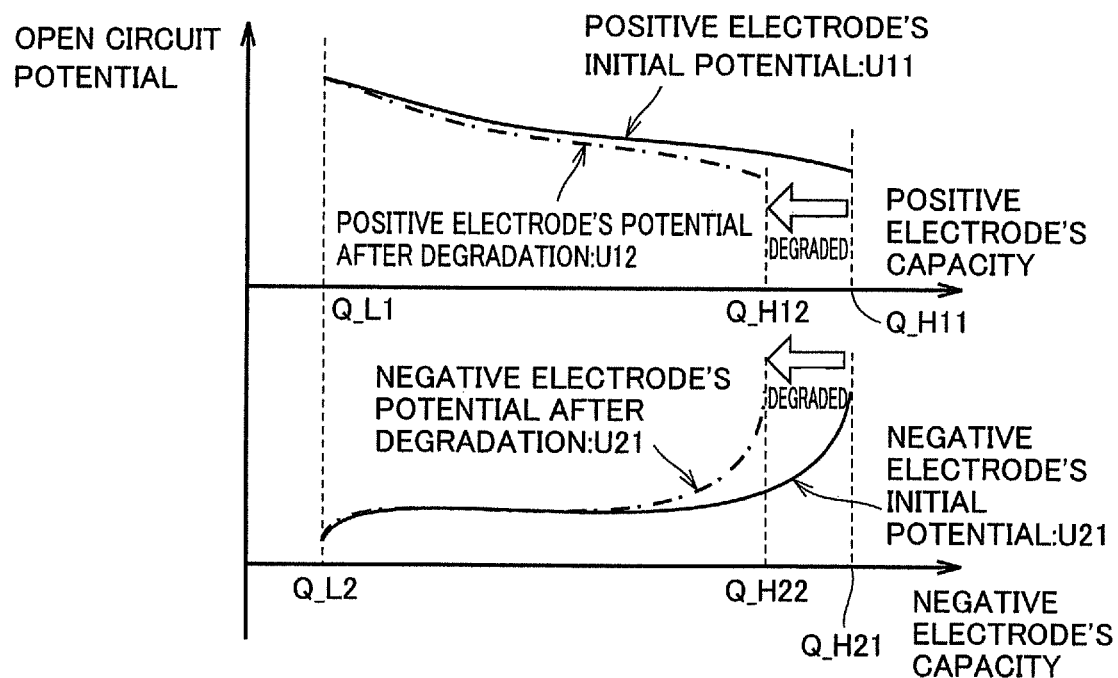
FIG. 10 is a graph schematically showing how a single electrode's open circuit potential varies as its capacity decreases.

FIG. 10 is a graph schematically showing how a single electrode's open circuit potential varies as its capacity decreases.

In FIG. 10, on the axis of the positive electrode's capacity, Q_L1 is a capacity corresponding to local SOC=θL1 in FIG. 9 when the rechargeable lithium ion battery is in the initial state. Q_H11 is a capacity corresponding to local SOC=θH1 in FIG. 9 when the rechargeable lithium ion battery is in the initial state. Furthermore, on the axis of the negative electrode's capacity, Q_L2 is a capacity corresponding to local SOC=θL2 in FIG. 9 when the rechargeable lithium ion battery is in the initial state, and Q_H21 is a capacity corresponding to local SOC=θH2 in FIG. 9 when the rechargeable lithium ion battery is in the initial state.

When the positive electrode has a reduced ability to accept lithium, the positive electrode's capacity corresponding to local SOC θ1 varies from Q_H11 to Q_H12. Furthermore, when the negative electrode has a reduced ability to accept lithium the negative electrode's capacity corresponding to SOC θ2 varies from Q_H21 to Q_H22.

Note that if the rechargeable lithium ion battery degrades, local SOC θ1 and the positive electrode's open circuit potential U1 have their relationship (see FIG. 9) unchanged. As such, when the relationship between local SOC θ1 and the positive electrode's open circuit potential U1 is converted into a relationship between the positive electrode's capacity and the positive electrode's open circuit potential, then, as represented in FIG. 10, the relationship between the positive electrode's capacity and the positive electrode's open circuit potential will be represented by a curve shrunk relative to that in the initial state by the rechargeable lithium ion battery's degradation.

Furthermore, when the relationship between local SOC θ2 and the negative electrode's open circuit potential U2 is converted into a relationship between the negative electrode's capacity and the negative electrode's open circuit potential, then, as represented in FIG. 10, the relationship between the negative electrode's capacity and the negative electrode's open circuit potential will be represented by a curve shrunk relative to that in the initial state by the rechargeable lithium ion battery's degradation.

Figure 11:
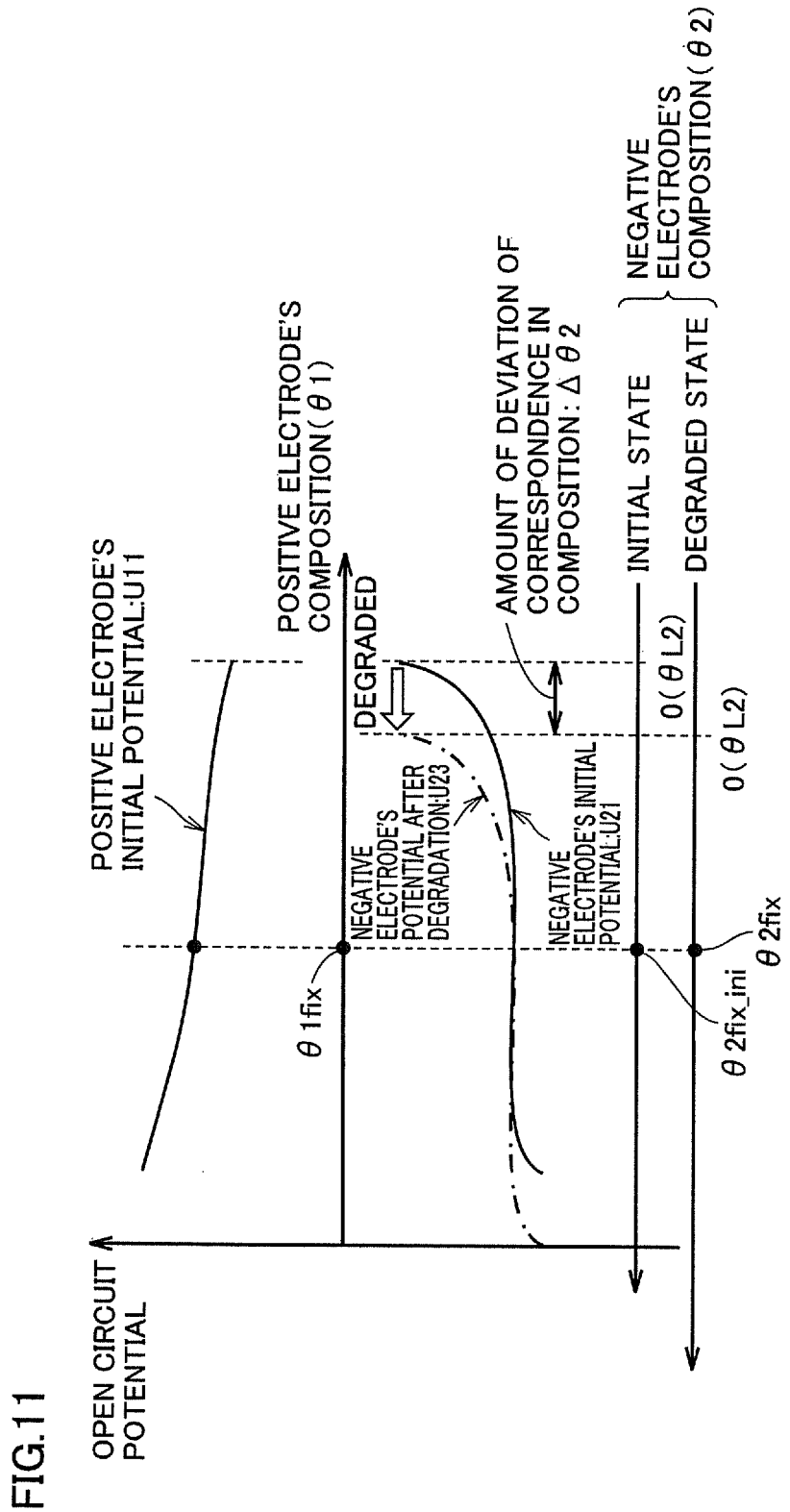
FIG. 11 is a conceptual diagram schematically representing a relationship between a deviation of a correspondence in composition between a positive electrode and a negative electrode, and their open circuit potentials.

FIG. 11 is a conceptual diagram schematically representing a relationship between a deviation of a correspondence in composition between the positive electrode and the negative electrode, and their open circuit potentials. A deviation of a correspondence in composition indicates that when a set of a positive electrode and a negative electrode is used to electrically charge/discharge a rechargeable lithium ion battery the positive electrode's composition (θ1) and the negative electrode's composition (θ2) in combination have a deviation from the initial state of the rechargeable lithium ion battery.

Single electrodes' respective compositions θ1, θ2 and open circuit potentials U1, U2 have a relationship represented by a curve similar to that represented in FIG. 9. Note that when the rechargeable lithium ion battery is degraded, the axis of the negative electrode's composition θ2 will shift by Δθ2 in a direction in which the positive electrode's composition θ1 decreases. Thus the negative electrode's composition θ2 and the negative electrode's open circuit potential U2 have a relationship represented by a curve shifted in a direction in which the positive electrode's composition θ1 decreases relative to a curve in the initial state by Δθ2.

The negative electrode's composition corresponding to the positive electrode's composition θ1fix with the rechargeable lithium ion battery in the initial state will be "θ2fix_ini", and once the rechargeable lithium ion battery has degraded it will be "θ2fix". Note that in FIG. 11 the negative electrode's composition 8L2 represented in FIG. 9 is 0, which represents that the negative electrode's lithium has all been drawn out.

The present embodiment introduces the above three degradation parameters of the positive electrode's capacity ratio k1, the negative electrode's capacity ratio k2, and an amount of deviation ΔQs of a correspondence in composition between the positive and negative electrodes to model the above two degradation phenomena.

The positive electrode's capacity ratio k1 is defined by a ratio of the positive electrode's capacity in a degraded state to that in an initial state, as described above. Herein, when it is assumed that the positive electrode's capacity is reduced by any amount from its initial capacity after the rechargeable lithium ion battery is degraded, then the positive electrode's capacity ratio k1 is represented by the following expression (3):

$$k1 = (Q1\_ini - \Delta Q1)/Q1\_ini \quad (3)$$

wherein 0<k1<1
where Q1_ini represents the positive electrode's capacity with the rechargeable lithium ion battery in the initial state (Q_H11 represented in FIG. 10) and ΔQ1 represents an amount by which the positive electrode's capacity decreases when the rechargeable lithium ion battery is degraded. The positive electrode's capacity Q1_ini can be previously obtained through an experiment.

The negative electrode's capacity ratio k2 is defined by a ratio of the negative electrode's capacity in a degraded state to that in the initial state, as described above. Herein, when it is assumed that the negative electrode's capacity is reduced by any amount from its initial capacity after the rechargeable lithium ion battery is degraded, then, the negative electrode's capacity ratio k2 is represented by the following expression (4):

$$k2=(Q2\_ini-\Delta Q2)/Q2\_ini \quad (4),$$

wherein 0<k2<1
where Q2_ini represents the negative electrode's capacity with the rechargeable lithium ion battery in the initial state (Q_H21 represented in FIG. 10) and ΔQ2 represents an amount by which the negative electrode's capacity decreases when the rechargeable lithium ion battery is degraded. The negative electrode's capacity Q2_ini can be previously obtained through an experiment.

Figure 12:
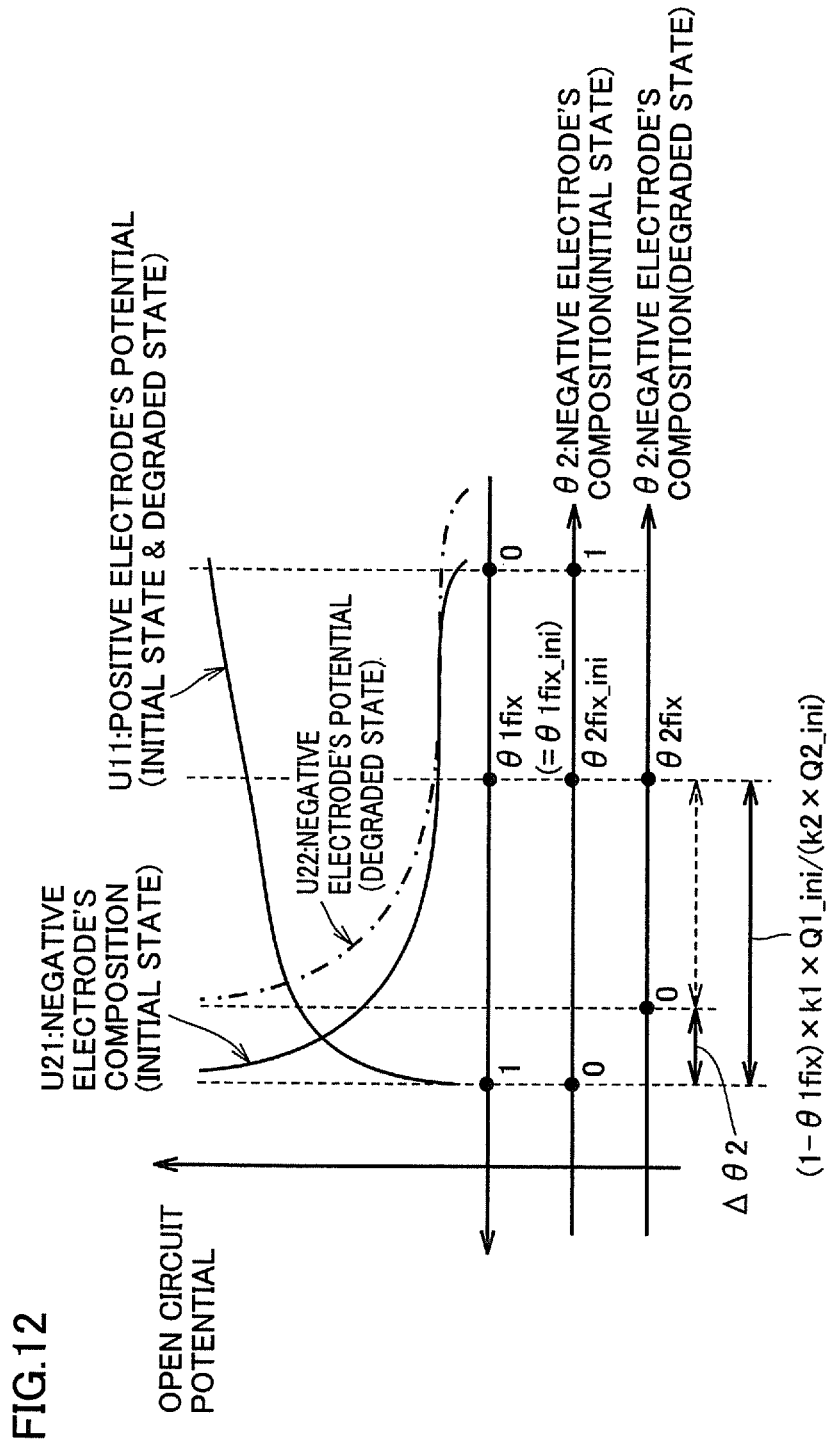
FIG. 12 is a schematic diagram for illustrating a deviation of a correspondence in composition caused by degradation.

FIG. 12 is a schematic diagram for illustrating a deviation of a correspondence in composition caused by degradation.

When the rechargeable lithium ion battery is degraded, the negative electrode with its composition θ2 of 1 will have a capacity of Q2_ini–ΔQ2. Furthermore, the positive electrode and the negative electrode have their respective compositions having a correspondence with a deviated capacity ΔQs, which is a capacity corresponding to an amount of deviation Δθ2 of the axis for the negative electrode's composition relative to that for the positive electrode's composition. Thus the relationship of the following expression (5) is established:

$$1{:}\Delta\theta2=(Q2\_ini-\Delta Q2){:}\Delta Qs \quad (5).$$

From expression (4) and expression (5), the following expression (6) is obtained:

$$\Delta Qs = (Q2\_ini - \Delta Q2) \times \Delta\theta2 \quad (6)$$
$$= k2 \times Q2\_ini \times \Delta\theta2.$$

When the rechargeable lithium ion battery is in the initial state, the positive electrode's composition θ1fix_ini corresponds to the negative electrode's composition θ2fix_ini. When the rechargeable lithium ion battery is in a degraded state, the positive electrode's composition θ1fix corresponds to the negative electrode's composition θ2fix. Furthermore, the deviation of the correspondence in composition is with reference to the positive electrode's composition θ1fix in the initial state. That is, the positive electrode's compositions θ1fix and θ1fix_ini are equal in value.

When the rechargeable lithium ion battery's degradation results in the positive and negative electrodes having their respective compositions having a correspondence with a deviation, the rechargeable lithium ion battery degraded has the positive and negative electrodes with their respective compositions θ1fix and θ2fix having a relationship of the following expressions (7) and (8):

$$\theta1fix=\theta1fix\_ini \quad (7),$$

$$\theta2fix=[(1-\theta1fix)\times k1\times Q1\_ini-\Delta Qs]/(k2\times Q2\_ini) \quad (8).$$

Expression (8) has a meaning, as described hereinafter. When the rechargeable lithium ion battery degrades, and accordingly, the positive electrode's composition θ1 varies (or is reduced) from 1 to θ1fix, the positive electrode discharges lithium in an amount represented by the following expression (9):

The positive electrode discharges lithium in an amount=$(1-\theta1fix)\times k1\times Q1\_ini$ (9).

Herein, 1–θ1fix has a value indicating how much the positive electrode's composition varies as the rechargeable lithium ion battery is degraded, and k1×Q1_ini has a value indicating the positive electrode's capacity after the rechargeable lithium ion battery is degraded.

If the lithium discharged from the positive electrode is all taken into the negative electrode, then the negative electrode's composition θ2fix will be represented by the following expression (10):

$$\theta2fix=(1-\theta1fix)\times k1\times Q1\_ini/(k2\times Q2\_ini) \quad (10).$$

Herein, k2×Q2_ini has a value representing the negative electrode's capacity after the rechargeable lithium ion battery is degraded.

On the other hand, when the positive and negative electrodes have compositions, respectively, having a correspondence with a deviation (Δθ2) then the negative electrode's composition infix is represented by the following expression (11):

$$\theta2fix=(1-\theta1fix)\times k1\times Q1\_ini/(k2\times-\Delta\theta2 \quad (11).$$

The amount of deviation Δθ2 of the correspondence in composition can be represented by expression (6), using deviated capacity ΔQs of the correspondence in composition. Thus the negative electrode's composition θ2fix is represented by the above expression (8).

As shown in FIG. 12, when the rechargeable lithium ion battery is in a degraded state, open circuit voltage OCV is represented as a potential difference between the positive electrode's open circuit potential U11 and the negative electrode's open circuit potential U22 in the degraded state. That is, estimating three degradation parameters k1, k2, ΔQs allows the negative electrode's open circuit potential U22 with the rechargeable lithium ion battery in a degraded state to be determined, and open circuit voltage OCV can be calculated as a potential difference between the negative electrode's open circuit potential U22 and the positive electrode's open circuit potential U11.

Furthermore, in the present embodiment, degradation parameters k1, k2, and ΔQs are used to estimate the rechargeable lithium ion battery's internal state, more specifically, whether the rechargeable lithium ion battery is degraded as lithium deposits. Generally, a rechargeable lithium ion battery's degradation includes that attributed to deposition of lithium and that attributed to wear, and distinguishing these types of degradation and thus determining (or estimating) them allows a state of degradation to be determined in detail.

Degradation attributed to wear is a type of degradation of the rechargeable lithium ion battery excluding degradation attributed to deposition of lithium, and means that as the battery electrically conducts or is left or the like its positive and negative electrodes' performance (or ability to accept lithium) is impaired. For example, it includes, as one example, that the positive/negative electrodes have their active materials worn. On the other hand, degradation attributed to deposition of lithium indicates that the lithium ions used for a battery's reaction change into a byproduct (mainly, metallic lithium), and thus no longer contribute to cell reaction.

When the rechargeable lithium ion battery is not degraded, open circuit voltage OCV will coincide with that of the rechargeable lithium ion battery in the initial state. That is, when the positive electrode's capacity ratio k1 and the negative electrode's capacity ratio k2 are 1 and deviated capacity ΔQs of the correspondence in composition is 0, open circuit voltage OCV calculated (or estimated) as described above will coincide with a value of open circuit voltage OCV (as measured) that is obtained when the rechargeable lithium ion battery is in the initial state (or unused).

Figure 13:
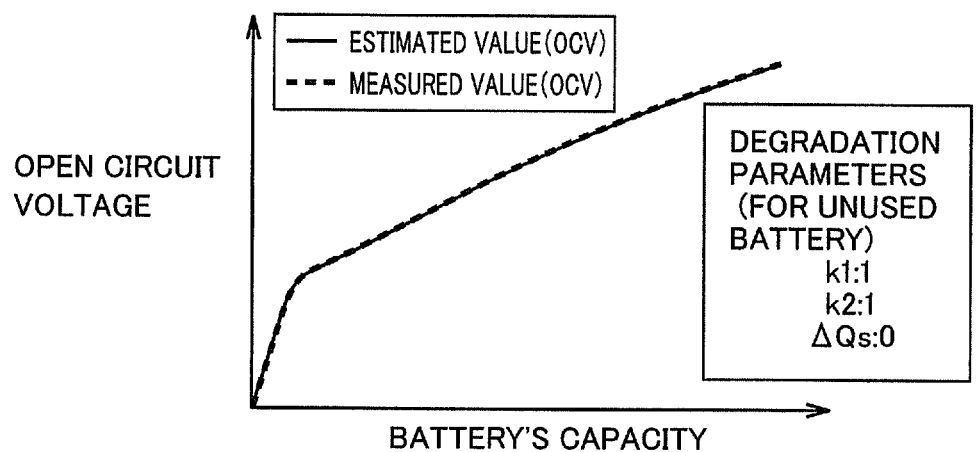
FIG. 13 is a figure for illustrating a degradation parameter when an open circuit voltage curve (as estimated) is brought to coincide with an open circuit voltage curve (as measured) when an unused rechargeable lithium ion battery is used.

FIG. 13 shows a relationship between the rechargeable lithium ion battery's capacity (SOC) and open circuit voltage OCV (i.e., an open circuit voltage characteristic). Hereinafter, a curve shown in FIG. 13 and the like that represents an open circuit voltage characteristic will also be referred to as an "open circuit voltage curve." In FIG. 13, a dotted line indicates an open circuit voltage curve (as measured), and a solid line indicates an open circuit voltage curve (as estimated). The open circuit voltage curve (as estimated) overlaps the open circuit voltage curve (as measured).

In FIG. 13, the axis of ordinate represents open circuit voltage OCV, and the axis of abscissa represents the rechargeable lithium ion battery's capacity.

When the rechargeable lithium ion battery degrades, open circuit voltage (as measured) OCV will vary. Herein, FIG. 14 (a figure corresponding to FIG. 13) shows a dotted line, which indicates a result of having measured an open circuit voltage curve (as measured) of a rechargeable lithium ion battery degraded only by deposition of lithium, that is, a rechargeable lithium ion battery free of degradation attributed to wear.

If the rechargeable lithium ion battery is held at low temperature, degradation attributed to wear can be suppressed, and this allows deposition of lithium to be alone caused while degradation attributed to wear is suppressed. By conducting an experiment of whether degradation attributed to wear is caused under a plurality of temperature conditions, a temperature set to set the rechargeable lithium ion battery at low temperature can be determined. This allows degradation attributed to deposition of lithium to be alone caused in the rechargeable lithium ion battery.

Figure 14:
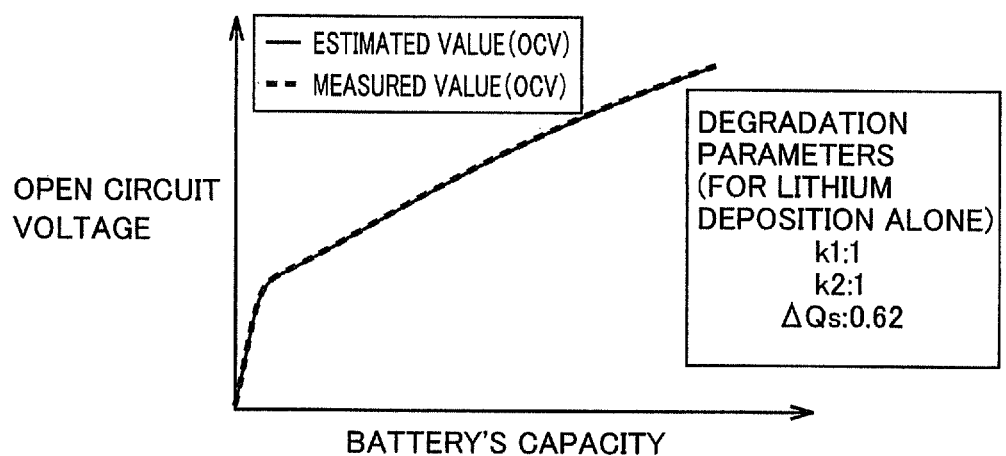
FIG. 14 is a figure for illustrating a degradation parameter when an open circuit voltage curve (as estimated) is brought to coincide with an open circuit voltage curve (as measured) when degradation attributed to deposition of lithium is alone caused.

Correctly estimating the three degradation parameters (k1, k2, ΔQs) allows an open circuit voltage curve (as estimated) to substantially coincide with the open circuit voltage curve (as measured) represented in FIG. 14. In other words, the three degradation parameters can be searched for to cause the open circuit voltage curve (as estimated) to substantially coincide with the open circuit voltage curve (as measured).

FIG. 14 represents open circuit voltage (as measured) OCV and open circuit voltage (as estimated) OCV substantially coinciding with each other. This open circuit voltage curve (as estimated) is determined with degradation parameters as follows: the positive electrode's capacity ratio k1 of 1; the negative electrode's capacity ratio k2 of 1; and the compositions having a correspondence with deviated capacity ΔQs of 0.62. These degradation parameter values can be obtained by searching for and obtaining the three degradation parameters (k1, k2, ΔQs) allowing the open circuit voltage curve (as estimated) to substantially coincide with the open circuit voltage curve (as measured) represented in FIG. 14.

Figure 15:
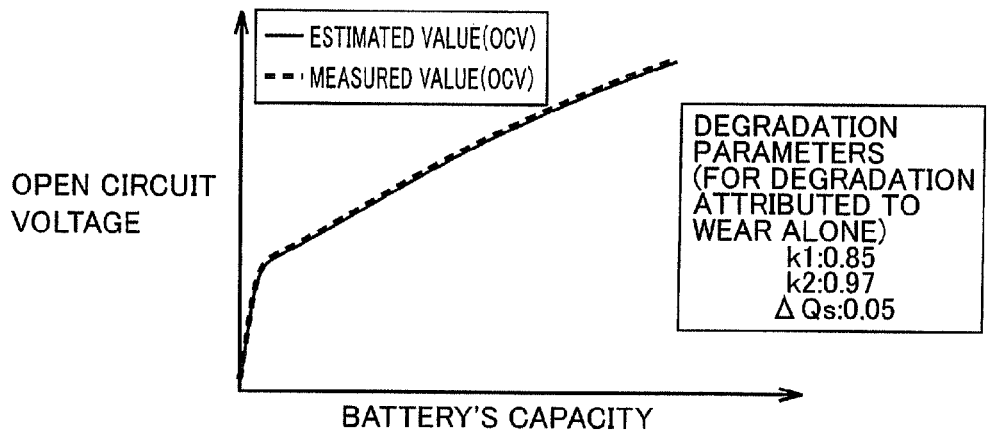
FIG. 15 is a figure for illustrating a degradation parameter when an open circuit voltage curve (as estimated) is brought to coincide with an open circuit voltage curve (as measured) when degradation attributed to wear is alone caused.

FIG. 15 indicates a result of having measured an open circuit voltage curve (as measured) of a rechargeable lithium ion battery degraded by wear alone, that is, a rechargeable lithium ion battery which does not have lithium deposited therein. In FIG. 15, the axis of ordinate represents open circuit voltage OCV, and the axis of abscissa represents the rechargeable lithium ion battery's capacity.

If the rechargeable lithium ion battery is held at high temperature, deposition of lithium can be suppressed, and this allows degradation attributed to wear to be alone caused while deposition of lithium is suppressed. By conducting an experiment of whether lithium deposits under a plurality of temperature conditions, a temperature set to set the rechargeable lithium ion battery at high temperature can be determined. The temperature set can be 50° C., for example. This allows degradation attributed to wear to be alone caused in the rechargeable lithium ion battery.

FIG. 15 represents open circuit voltage (as measured) OCV and open circuit voltage (as estimated) OCV substantially coinciding with each other. At the time, an open circuit voltage curve (as estimated) is determined with degradation parameters as follows: the positive electrode's capacity ratio k1 of 0.85; the negative electrode's capacity ratio k2 of 0.97; and the compositions having a correspondence with deviated capacity ΔQs of 0.05. These degradation parameter values can be obtained by searching for and obtaining the three degradation parameters (k1, k2, ΔQs) allowing the open circuit voltage curve (as estimated) to substantially coincide with the open circuit voltage curve (as measured) represented in FIG. 15.

As shown in FIG. 14 and FIG. 15, it can be seen that the rechargeable lithium ion battery that is degraded only by deposition of lithium has only one of the three degradation parameters (k1, k2, ΔQs), i.e., deviated capacity ΔQs of the correspondence in composition, varied from ΔQs (=0) of the rechargeable lithium ion battery unused (or in the initial state).

Furthermore, it can be seen that the rechargeable lithium ion battery degraded only by wear has the three degradation parameters (k1, k2, ΔQs) all deviating from those of the rechargeable lithium ion battery unused (or in the initial state). Note that degradation attributed to wear provides the compositions with a correspondence therebetween having a deviated capacity ΔQs smaller than degradation attributed to deposition of lithium does.

Lithium may deposit because, for example, lithium ions discharged from the positive electrode in electrically charging the battery may not be taken into the negative electrode. In that case, the positive electrode and the negative electrode will have their compositions with a correspondence having a deviation, and deviated capacity ΔQs will vary. Furthermore, deposition of lithium caused alone does not impair the positive and negative electrodes' ability to accept lithium, and accordingly, the positive electrode's capacity ratio k1 and the negative electrode's capacity ratio k2 will each be held at 1.

Thus, deviated capacity ΔQs includes a deviated capacity ΔQs(Li) resulting from degradation attributed to deposition of lithium, and a deviated capacity ΔQs(W) resulting from degradation attributed to wear, and accordingly, separating one from the other allows quantitative estimation of an amount of lithium deposited.

Initially, a map used to identify a component of degradation that is attributed to wear will be described. This map represents a correspondence between the positive and negative electrodes' capacity ratios k1 and k2 and deviated capacity ΔQs of a correspondence in composition when the rechargeable lithium ion battery is degraded by wear alone. The map can be previously created based on a result of an experiment. As has been set forth above, holding the rechargeable lithium ion battery at high temperature can prevent deposition of lithium, and thus allows an experiment to be conducted to cause degradation attributed to wear alone.

Degradation attributed to wear is gradually advanced to decrease the rechargeable lithium ion battery's capacity (i.e., full charge capacity) gradually by a predetermined amount. Whenever the rechargeable lithium ion battery's capacity is decreased, the rechargeable lithium ion battery's open circuit voltage OCV is measured. This allows data to be obtained that indicates how the rechargeable lithium ion battery varies in open circuit voltage OCV as the rechargeable lithium ion battery varies in capacity when the rechargeable lithium ion battery has its capacity degraded as prescribed (i.e., an open circuit voltage curve (as measured)). For example, until the rechargeable lithium ion battery has a capacity reaching from 100% to 50%, the capacity is decreased (or degraded) by 5% at a time, and whenever the capacity is decreased, the rechargeable lithium ion battery's open circuit voltage OCV is measured.

Then, the degradation parameters (the positive electrode's capacity ratio k1, the negative electrode's capacity ratio k2, and deviated capacity ΔQs) can be searched for for causing open circuit voltage (as estimated) OCV to coincide with open circuit voltage (as measured) OCV obtained for each capacity degradation.

Thus, the map (hereinafter also referred to as a map for degradation attributed to wear) shown in FIG. 16 can be obtained. The FIG. 16 map shows a correspondence between the positive and negative electrodes' capacity ratios k1 and k2 and deviated capacity ΔQs(W), and for example, the positive electrode's capacity ratio k1 and the negative electrode's capacity ratio k2 can be selected to determine deviated capacity ΔQs(W) resulting from degradation attributed to wear. The map can be stored in a memory.

Note that in the present embodiment, obtaining data indicating how battery module 10 or battery cell 20 varies in open circuit voltage (as measured) OCV as it varies in capacity (i.e., an open circuit voltage curve), as shown in FIG. 13 to FIG. 15, allows degradation parameters (k1, k2, ΔQs) to be searched for so that open circuit voltage (as estimated) OCV may coincide with open circuit voltage (as measured) OCV.

An open circuit voltage curve can be obtained through electrically charging/discharging battery module 10 or battery cell 20 (or a rechargeable lithium ion battery) that has completely been used off board. It should be noted that the open circuit voltage curve can also be measured on board while the rechargeable lithium ion battery is in use. For example, it can also be measured by ECU 120 for each battery block on board while battery module 10 is in use. For example, when the rechargeable lithium ion battery is relaxed (or a state with the battery's current=0 continues), the battery's voltage can be sensed and how the battery's open circuit voltage varies can be measured therefrom, and the battery's current Ib can be integrated, and from the integral, how the battery's capacity varies can be measured.

Figure 17:
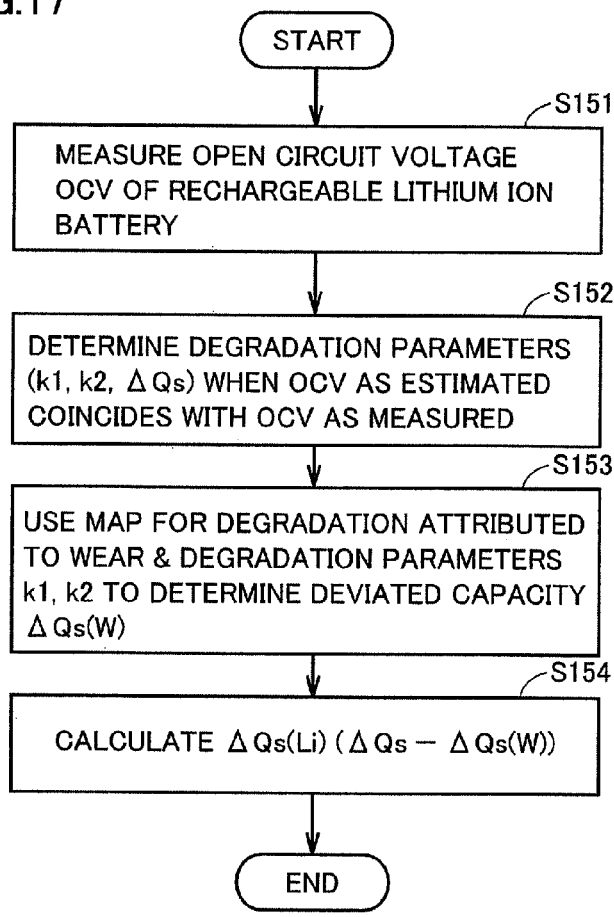
FIG. 17 is a flowchart of a procedure of a controlling process for obtaining a degradation parameter of a rechargeable lithium ion battery off board.

FIG. 17 is a flowchart showing a controlling process procedure performed by MPU 131 for obtaining a degradation parameter of a rechargeable lithium ion battery by battery checker 130 off board.

With reference to FIG. 17, MPU 131 at Step S151 measures open circuit voltage (as measured) OCV of the rechargeable lithium ion battery (battery module 10 or battery cell 20) subject to determination of whether it is degraded, based on an output of voltage sensor 15b. Specifically, measuring open circuit voltage (as measured) OCV while electrically charging/discharging the rechargeable lithium ion battery allows an open circuit voltage curve (as measured) to be obtained.

MPU 131 at Step S152 appropriately modifies three degradation parameters (the positive electrode's capacity ratio k1, the negative electrode's capacity ratio k2, and deviated capacity ΔQs) and thus determines whether open circuit voltage (as estimated) OCV determined by the three degradation parameters coincides with open circuit voltage (as measured) OCV obtained at Step S151.

Figure 18:
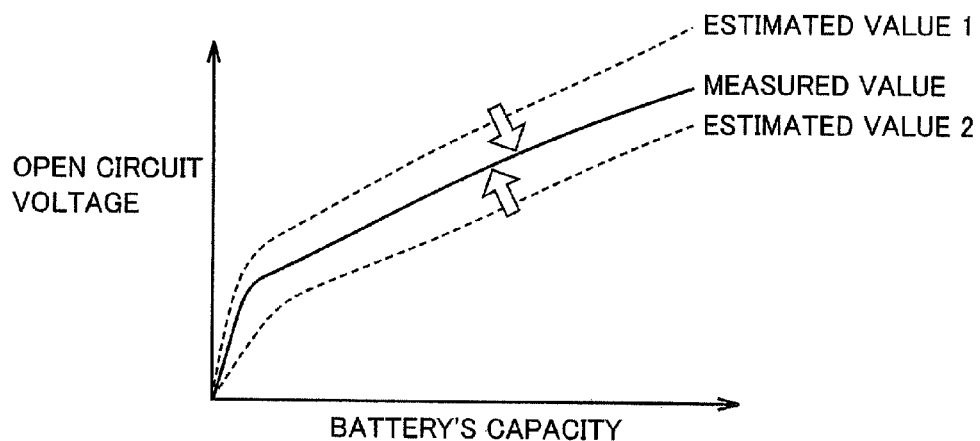
FIG. 18 is a conceptual diagram for describing a process causing an open circuit voltage curve (as estimated) to coincide with an open circuit voltage curve (as measured).

As shown in FIG. 18, specifically, the three degradation parameters are set in any combination and thus used to calculate open circuit voltage (as estimated) OCV. FIG. 18 shows an example of a relationship between open circuit voltage (as estimated) OCV represented by a dotted line and open circuit voltage (as measured) OCV represented by a solid line.

In FIG. 18, when an open circuit voltage curve of an estimated value 1 is obtained, open circuit voltage (as estimated) OCV is higher than open circuit voltage (as measured) OCV, and accordingly, the degradation parameters are re-set to approach the open circuit voltage curve as measured. Similarly, when an open circuit voltage curve of an estimated value 2 is obtained, open circuit voltage (as estimated) OCV is lower than open circuit voltage (as measured) OCV, and accordingly, the degradation parameters are re-set to approach the open circuit voltage curve as measured. Thus, the degradation parameters can repeatedly be re-set to allow open circuit voltage (as estimated) OCV to coincide with open circuit voltage (as measured) OCV.

Again with reference to FIG. 17, MPU 131 at Step S152 determines the degradation parameters when open circuit voltage (as estimated) OCV coincides with open circuit voltage (as measured) OCV. The positive electrode's capacity ratio k1, the negative electrode's capacity ratio k2, and deviated capacity ΔQs are thus determined. Note that deviated capacity ΔQs determined at Step S152 is a deviated capacity including both a deviated capacity resulting from degradation attributed to deposition of lithium and a deviated capacity resulting from degradation attributed to wear.

If open circuit voltage (as estimated) OCV does not completely coincide with open circuit voltage (as measured) OCV, setting a range in which they are regarded as coinciding with each other (i.e., a tolerable error) allows whether open circuit voltage (as estimated) OCV and open circuit voltage (as measured) OCV coincide with each other to be determined.

MPU 131 at Step S153 uses the positive and negative electrodes' capacity ratios k1 and k2 determined at Step S152 and the map for degradation attributed to wear (see FIG. 16) to determine deviated capacity ΔQs(W). Furthermore, MPU 131 at Step S154 obtains a difference between deviated capacity ΔQs obtained at Step S152 and deviated capacity ΔQs(W) obtained at Step S153. This calculates deviated capacity ΔQs(Li) resulting from degradation attributed to deposition of lithium.

Thus an open circuit voltage characteristic of the rechargeable lithium ion battery (battery module 10 or battery cell 20) can be measured off board to obtain degradation parameters, or the positive electrode's capacity ratio k1, the negative electrode's capacity ratio k2, and deviated capacity ΔQs. Furthermore, deviated capacity ΔQs can be separated into deviated capacity ΔQs(W) resulting from degradation attributed to wear and deviated capacity ΔQs(Li) resulting from degradation attributed to deposition of lithium to allow deposition of lithium to be quantitatively estimated without disassembling the rechargeable lithium ion battery and conducting a chemical analysis.

Again with reference to FIG. 8, lithium deposition measurement unit 170 measures through the above described degradation diagnosis deviated capacity ΔQs (Li) resulting from degradation attributed to deposition of lithium as a parameter representing an amount of lithium deposited. Lithium deposition measurement unit 170 can measure parameter ΔQs (Li) either before or after re-restraint through a charging and discharging test using battery checker 130. In other words, lithium deposition measurement unit 170 corresponds to a "first measurement unit" if it measures the full charge capacity after re-restraint, and lithium deposition measurement unit 170 corresponds to a "second measurement unit" if it measures the full charge capacity before re-restraint.

Evaluation unit 190 reflects battery parameter ΔQs(Li) representing an amount of lithium deposited to generate value information of battery module 10 reused.

Thus according to the second embodiment of the present invention an amount of lithium deposited, which has a large effect on the rechargeable lithium ion battery in performance (or life expectancy), can further be reflected to more accurately calculate a value of battery module 10 reused.

Second Embodiment in Exemplary Variation

The second embodiment in an exemplary variation provides the process that has been described in the second embodiment (see FIG. 17) on board. For example a process similar to that of the second embodiment is performed by a controller (ECU 120) controlling electrically charging/discharging a rechargeable lithium ion battery mounted in an electrically powered vehicle. An electrically powered vehicle which can electrically charge an in-vehicle battery (a rechargeable lithium ion battery) from a power supply external to the vehicle, is used. Such a vehicle includes a plug-in hybrid vehicle (PHV) and an electric vehicle (EV).

Figure 19:
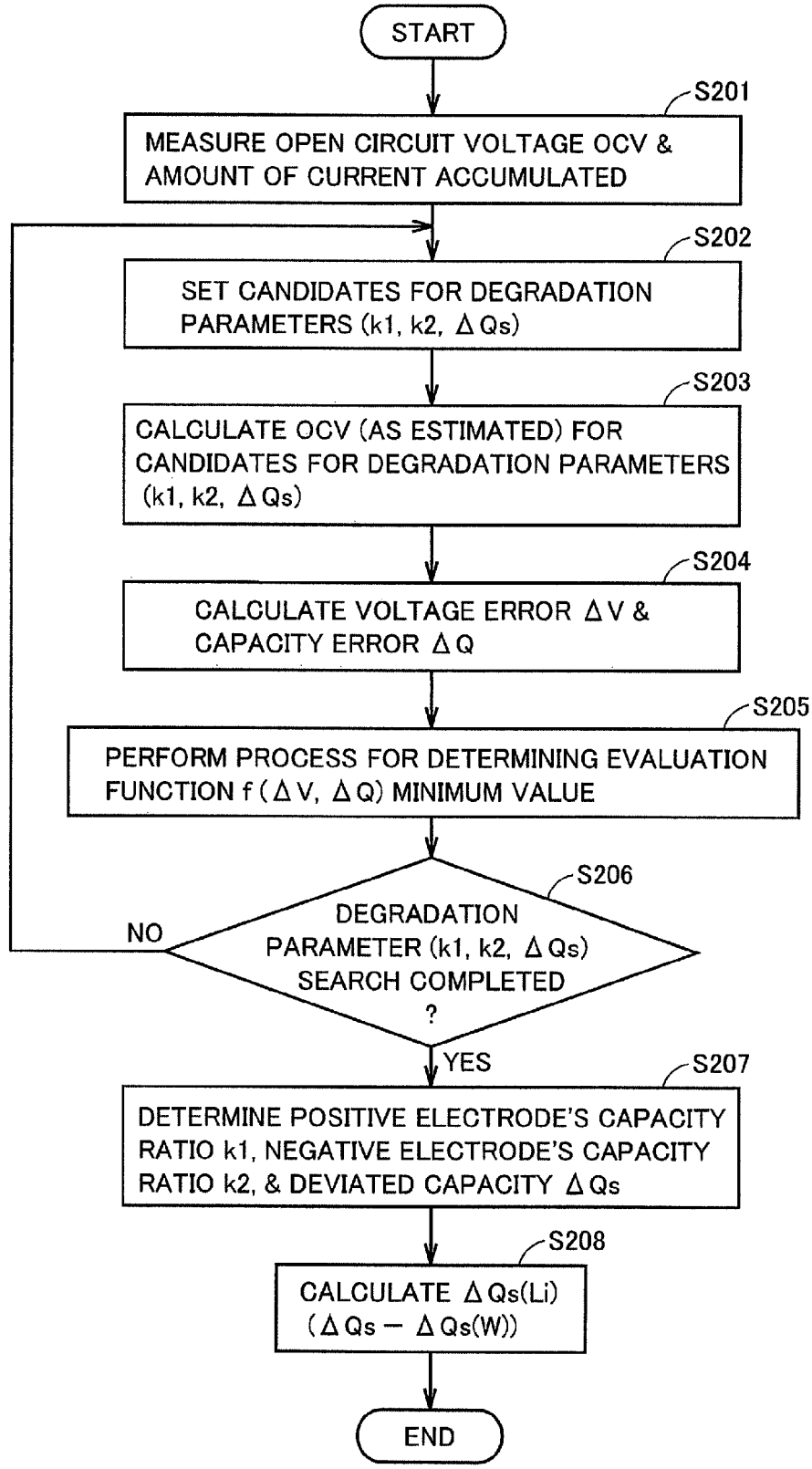
FIG. 19 is a flowchart of a procedure of a controlling process for obtaining a degradation parameter of a rechargeable lithium ion battery that is mounted in a vehicle on board.

FIG. 19 is a flowchart showing a procedure of a controlling process for obtaining a degradation parameter of a rechargeable lithium ion battery that is mounted in a vehicle on board. The FIG. 19 process is performed by a controller (ECU 120 indicated in FIG. 2 for example) mounted in a vehicle.

ECU 120 at Step S201 measures open circuit voltage (as measured) OCV of the rechargeable lithium ion battery (battery module 10) and an amount of a current accumulated of the battery, as based on an output of the voltage sensor and that of the current sensor that are included in battery sensor 15. Specifically, when the rechargeable lithium ion battery mounted in a vehicle is electrically charged, open circuit voltage (as measured) OCV and an amount of a current accumulated are measured, as appropriate, and a curve can thus be obtained that indicates how the battery's open circuit voltage (as measured) OCV varies as its capacity varies (i.e., an open circuit voltage curve as a measured value).

ECU 120 at Step S202 sets (or selects) candidates for degradation parameters (i.e., the positive electrode's capacity ratio k1, the negative electrode's capacity ratio k2, and deviated capacity ΔQs) for determining open circuit voltage (as estimated) OCV. While the degradation parameters can be set in various methods, preferably, a method is selected for efficiently performing an operation process for setting the degradation parameters.

For example, a degradation parameter may be selected within a range which is previously determined through an experiment or the like and in which degradation attributed to wear and degradation attributed to deposition of lithium are actually caused. Note that the positive electrode's capacity ratio k1 and the negative electrode's capacity ratio k2 depend solely on degradation attributed to wear, and accordingly, the positive electrode's capacity ratio k1 and the negative electrode's capacity ratio k2 can be varied within a range within which degradation attributed to wear is actually caused. Once the positive electrode's capacity ratio k1 and the negative electrode's capacity ratio k2 have been determined, the map for degradation attributed to wear (FIG. 16) can be used to determine deviated capacity ΔQs(W) resulting from degradation attributed to wear. Once deviated capacity ΔQs(W) has been determined, what is necessary is simply to vary deviated capacity ΔQs(Li).

Then, ECU 120 at Step S203 uses the degradation parameters set at Step S202 to calculate a characteristic indicating how open circuit voltage (as estimated) OCV varies as the capacity varies (i.e., an open circuit voltage curve as an estimated value).

ECU 120 at Step S204 calculates an error between the open circuit voltage curve (as estimated) calculated at Step S203 and the open circuit voltage curve (as measured) obtained at Step S201. This error includes a voltage error and a capacity error.

Figure 20:
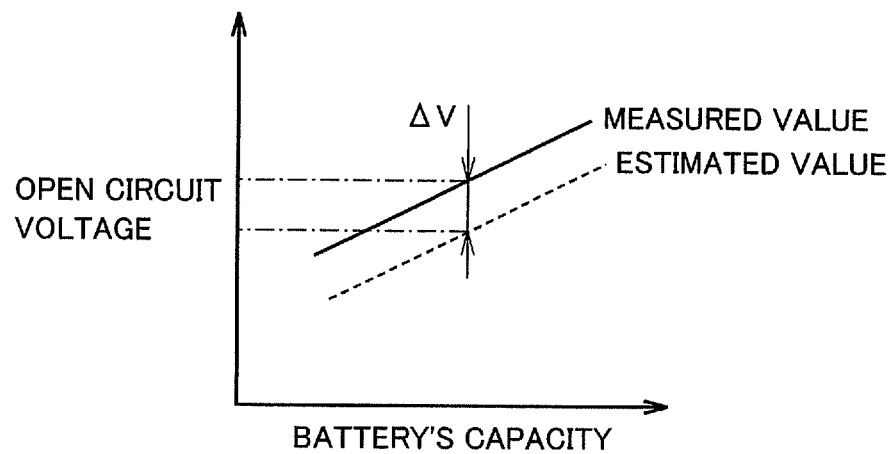
FIG. 20 is a figure representing an error voltage between an open circuit voltage curve (as estimated) and an open circuit voltage curve (as measured).

A voltage error ΔV (see FIG. 20) can be calculated specifically by comparing the open circuit voltage curve (as estimated) and the open circuit voltage curve (as measured). Voltage error ΔV may be a voltage error in a specific battery capacity, or may be an average of voltage errors between two open circuit voltage curves.

Furthermore, a capacity error ΔQ can be obtained for example in a method described hereinafter. Initially, the open circuit voltage curve (as estimated) is used to calculate a capacity Q1 between an open circuit voltage before the battery is electrically charged and an open circuit voltage after the battery is electrically charged. Furthermore, after electrically charging the battery is started before doing so ends, a current is sensed and accumulated in value, and a charged capacity Q2 can be calculated therefrom. By obtaining a difference between capacity Q1 and capacity Q2, an absolute value of capacity error ΔQ (|Q1−Q2|) can be obtained.

Note that it is difficult to obtain an open circuit voltage curve (as measured) for a hybrid vehicle which is not equipped with a charger by an external power supply. However, when the rechargeable lithium ion battery is relaxed, some open circuit voltages located on the open circuit voltage curve (as measured) can be measured. Note that when the rechargeable lithium ion battery passes a current or immediately after it has a current interrupted or the like, there is a difference in concentration of lithium in the active material and open circuit voltage cannot be measured accurately.

On the other hand, once time has elapsed after the rechargeable lithium ion battery was interrupted from electrical conduction, the rechargeable lithium ion battery will be relaxed, and accordingly there is no difference in concentration of lithium and open circuit voltage can accurately be measured. The rechargeable lithium ion battery is relaxed for example when a vehicle is stopped beyond a predetermined period of time. Thus, open circuit voltage (as measured) OCV of the rechargeable lithium ion battery for when the battery has a specific capacity can be obtained.

Figure 21:
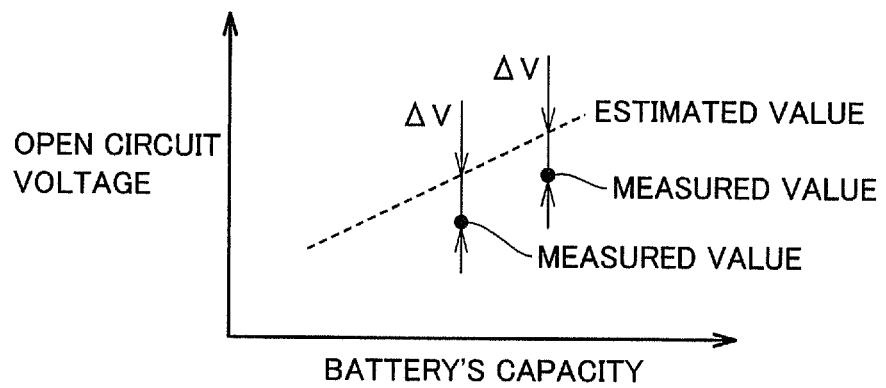
FIG. 21 is a figure showing an error voltage between an open circuit voltage curve (as estimated) and open circuit voltage.

The specific open circuit voltage measured for the specific capacity allows an open circuit voltage (as measured) to be compared with an open circuit voltage curve (as estimated) to obtain voltage error ΔV, as shown in FIG. 21. Furthermore, if a plurality of open circuit voltages (as measured) are measured, capacity error ΔQ can be obtained as described above. Specifically, an open circuit voltage curve (as estimated) is used to calculate capacity Q1 between open circuit voltages of two points (as measured). Furthermore, measuring a value of an accumulated current when the open circuit voltages (as measured) of the two points are obtained allows the value to be used to calculate capacity Q2. Then, a difference of capacity Q1 and capacity Q2 (|Q1−Q2|) can be calculated to obtain an absolute value of capacity error ΔQ.

ECU 120 at Step S205 calculates an evaluation function f (ΔV, ΔQ) for voltage error ΔV and capacity error ΔQ obtained at Step S204. As evaluation function f (ΔV, ΔQ), voltage error ΔV and capacity error ΔQ with a weight added thereto can be used.

Furthermore, ECU 120 determines whether evaluation function f (ΔV, ΔQ) calculated from the currently set degradation parameters is smaller than evaluation function f (ΔV, ΔQ) calculated from the immediately previously set degradation parameters. Herein, if the current evaluation function f (ΔV, ΔQ) is smaller than the immediately previous evaluation function f (ΔV, ΔQ), the former is stored to a memory. If the current evaluation function f (ΔV, ΔQ) is larger than the immediately previous evaluation function f (ΔV, ΔQ), the latter will remain stored in the memory.

ECU 120 at Step S206 determines whether each degradation parameter has been varied throughout a search range, and if so, ECU 120 proceeds to Step S207. Otherwise, ECU 120 returns to Step S202.

Thus, Steps S202-S206 are repeated until each degradation parameter has been varied throughout the search range. Then, evaluation function f (ΔV, ΔQ) that serves as a minimum value is determined and an open circuit voltage curve for which this evaluation function (or the minimum value) is obtained can be determined, and the degradation parameters (k1, k2, ΔQs) defining an open circuit voltage curve (as estimated) can be determined. Determining degradation parameters allowing an evaluation function to indicate a minimum value allows a degraded state (i.e., degradation attributed to wear and degradation attributed to deposition of lithium) to be determined more precisely.

Herein, deviated capacity ΔQs that is determined includes deviated capacity ΔQs(W) by degradation attributed to wear, and deviated capacity ΔQs(Li) by degradation attributed to deposition of lithium. Accordingly, ECU 120 at Step S207 uses degradation parameters determined through Steps S202-S206 (i.e., the positive electrode's capacity ratio k1 and the negative electrode's capacity ratio k2) and the map for degradation attributed to wear (see FIG. 10) to determine deviated capacity ΔQs(W) resulting from degradation attributed to wear. Then, ECU 120 at Step S208 calculates a difference between deviated capacity ΔQs determined through Steps S202-S206 and deviated capacity ΔQs(W) obtained at Step S207 to calculate deviated capacity ΔQs(Li) attributed to deposition of lithium.

Thus the second embodiment in the exemplary variation allows a rechargeable lithium ion battery mounted in an electrically powered vehicle to be diagnosed for degradation, as based on an open circuit voltage characteristic, to obtain a positive electrode's capacity ratio k1, a negative electrode's capacity ratio k2, and deviated capacity ΔQs on board. In particular, for both a PHV and an EV having a function using a power supply external to the vehicle to externally electrically charge an in-vehicle battery, and a hybrid vehicle which is not equipped with the function, a degradation parameter can be obtained on board, based on an open circuit voltage characteristic, and parameter ΔQs (Li) representing an amount of lithium deposited can also be measured.

In the second embodiment in the exemplary variation, lithium deposition measurement unit 170 of FIG. 8 can obtain parameter ΔQs (Li) through data communication between battery checker 130 and ECU 120. The remaining operation is similar to that in the second embodiment, and accordingly, will not be described repeatedly in detail.

Thus according to the second embodiment in the exemplary variation a battery parameter indicating an amount of lithium deposited, which has a large effect on the rechargeable lithium ion battery in performance (or life expectancy), can be obtained without battery checker 130 performing measurement off board. This can reduce a period of time required to calculate a value of battery module 10 reused, as compared with the second embodiment.

As has been described in the second embodiment and its exemplary variation, battery parameter ΔQs (Li) can be obtained off board or on board, and thus measured as timed as desired.

How lithium deposits in a rechargeable lithium ion battery, however, may vary depending on environmental conditions. For example, it is known that battery cell 20 left at high temperature for a long period of time has lithium deposited in a reduced amount. Accordingly, if possible, battery parameter ΔQs (Li) is measured before or after the re-restraint step (the FIG. 6 Step S130), preferably after re-restraint.

Note that while the second embodiment and its exemplary variation have been described such that a rechargeable battery (a rechargeable lithium ion battery) subject to determination of degradation is a rechargeable battery mounted in an electrically powered vehicle, the present invention is not limited thereto. That is, the present value calculation technique is applicable to reusing a rechargeable battery that is used with a plurality of battery cells restrained by a restraint member.

Furthermore, while the present embodiment has been described with a battery parameter exemplified by full charge capacity, internal resistance, and amount of lithium deposited, other battery parameters can also be adopted to calculate a value of a rechargeable battery in accordance with the present invention. For example, as a known parameter, a diffusion coefficient Ds of a reaction-participating material (such as lithium in a rechargeable lithium ion battery) described in Japanese Patent Laying-Open No. 2008-241246 can be adopted as a degradation indicator. Alternatively, a positive electrode's capacity ratio k1, a negative electrode's capacity ratio k2, deviated capacity ΔQs, and deviated capacity ΔQs(W) resulting from degradation attributed to wear, as described in the second embodiment, can also be introduced as additional battery parameters.

It should be understood that the embodiments disclosed herein are illustrative and non-restrictive in any respect. The scope of the present invention is defined by the terms of the claims, rather than the description above, and is intended to include any modifications within the scope and meaning equivalent to the terms of the claims.

Industrial Applicability

The present invention is applicable to a technique for reusing a rechargeable battery that is used as a battery pack with a plurality of battery cells restrained by a restraint member.

Reference Signs List

10: battery module; 11: positive electrode terminal; 12: negative terminal; 15: battery sensor; 15*a*: current sensor; 15*b*: voltage sensor; 15*c*: temperature sensor; 17: opening; 20: battery cell; 21: electrode; 30: emission gas flow path unit; 31: exhaust tube; 40: end plate; 41: battery holder; 42: restraint band; 45: rivet; 83: horizontal direction; 89: direction in which battery cells are stacked; 120: ECU; 130: battery checker; 131: MPU; 132: memory; 133: communication device; 135, 136: test terminal; 137, 138: switch; 150: capacity data measurement unit; 160: internal resistance measurement unit; 170: lithium deposition measurement unit; 190: evaluation unit; 200: power supply; 210: load; 1*b*: battery current; OCV: open circuit voltage; Q1, Q2: charged capacity; Rp: internal resistance; TC: full charge capacity; U1, U2: open circuit potential; Vb: battery voltage; k1: positive electrode's capacity ratio; k2: negative electrode's capacity ratio; ΔQs: battery capacity fluctuation amount (deviated capacity); ΔQs (Li): deviated capacity (resulting from deposition of lithium); ΔQs (W): deviated capacity (resulting from degradation attributed to wear).

The invention claimed is:

1. A value calculation device for a rechargeable battery used with a plurality of battery cells restrained by a restraint member, comprising:
- a detector for detecting battery data obtained as said rechargeable battery is electrically charged and discharged;
- a first measurement unit for measuring a battery parameter of said rechargeable battery after said rechargeable battery has said restraint member removed therefrom and the plurality of battery cells has a portion thereof replaced and is thus disassembled when said rechargeable battery is subsequently re-restrained by said restraint member and thus reused, said measuring being based on said battery data detected after said rechargeable battery is re-restrained; and
- an evaluation unit for evaluating from said battery parameter a value of said rechargeable battery reused, said battery parameter at least including an internal resistance of said rechargeable battery.

2. The value calculation device for a rechargeable battery according to claim 1, further comprising a second measurement unit for measuring said battery parameter of one of said rechargeable battery and said battery cell before said rechargeable battery is re-restrained, said measuring being based on said battery data detected before said rechargeable battery is re-restrained, wherein:
- said battery parameter includes a first parameter measured by said first measurement unit and a second parameter measured by said second measurement unit;
- said first parameter includes said internal resistance; and
- said second parameter includes a full charge capacity of said rechargeable battery.

3. The value calculation device for a rechargeable battery according to claim 1, wherein:
- said rechargeable battery is a rechargeable lithium ion battery;
- said first measurement unit includes
  - a degradation parameter acquisition unit operative to perform a degradation diagnosis based on an open circuit voltage characteristic of said rechargeable lithium ion battery indicating how said rechargeable lithium ion battery varies in open circuit voltage as said rechargeable lithium ion battery varies in capacity to obtain a capacity ratio of a positive electrode of said rechargeable lithium ion battery, a capacity ratio of a negative electrode of said rechargeable lithium ion battery, and a battery capacity fluctuation amount, and
  - a lithium deposition estimation unit operative to apply said capacity ratios respectively of said positive and negative electrodes that are obtained to a previously obtained correspondence between said capacity ratios respectively of said positive and negative electrodes and a first amount of said battery capacity fluctuation amount to separate said battery capacity fluctuation amount that is obtained into said first amount and a second amount of said battery capacity fluctuation amount, said first amount corresponding to degradation attributed to wear, said second amount corresponding to degradation attributed to deposition of lithium; and
- one of said battery parameter and said first parameter includes said second amount.

4. The value calculation device for a rechargeable battery according to claim 2, wherein:
- said rechargeable battery is a rechargeable lithium ion battery;
- said second measurement unit includes
  - a degradation parameter acquisition unit operative to perform a degradation diagnosis based on an open circuit voltage characteristic of said rechargeable lithium ion battery indicating how said rechargeable lithium ion battery varies in open circuit voltage as said rechargeable lithium ion battery varies in capacity to obtain a capacity ratio of a positive electrode of said rechargeable lithium ion battery, a capacity ratio of a negative electrode of said rechargeable lithium ion battery, and a battery capacity fluctuation amount, and
  - a lithium deposition estimation unit operative to apply said capacity ratios respectively of said positive and negative electrodes that are obtained to a previously obtained correspondence between said capacity ratios respectively of said positive and negative electrodes and a first amount of said battery capacity fluctuation amount to separate said battery capacity fluctuation amount that is obtained into said first amount and a second amount of said battery capacity fluctuation amount, said first amount corresponding to degradation attributed to wear, said second amount corresponding to degradation attributed to deposition of lithium; and
- said second parameter includes said second amount.

5. A value calculation method for a rechargeable battery used with a plurality of battery cells restrained by a restraint member, comprising the steps of:
- detecting battery data after said rechargeable battery has said restraint member removed therefrom and is thus disassembled and the plurality of battery cells has a portion thereof replaced and when said rechargeable battery is subsequently re-restrained by said restraint member and thus reused, said battery data being detected as said rechargeable battery is electrically charged and discharged;
- measuring a battery parameter of said rechargeable battery after said rechargeable battery is re-restrained; and
- an evaluating a value of said rechargeable battery reused, said evaluating being based on said battery parameter measured in the step of measuring,
- said battery parameter at least including an internal resistance of said rechargeable battery.

6. The value calculation method for a rechargeable battery according to claim 5, further comprising the step of measuring said battery parameter of one of said rechargeable battery and said battery cell before said rechargeable battery is re-restrained, said measuring being based on said battery data detected before said rechargeable battery is re-restrained, wherein:
- said battery parameter includes a first parameter measured in the step of measuring after said rechargeable battery is re-restrained and a second parameter measured in the step of measuring before said rechargeable battery is re-restrained;
- said first parameter includes said internal resistance; and
- said second parameter includes a full charge capacity of said rechargeable battery.

7. The value calculation method for a rechargeable battery according to claim 5, wherein:
- said rechargeable battery is a rechargeable lithium ion battery;
- the step of measuring after said rechargeable battery is re-restrained includes the steps of
  - performing a degradation diagnosis based on an open circuit voltage characteristic of said rechargeable lithium ion battery indicating how said rechargeable lithium ion battery varies in open circuit voltage as said rechargeable lithium ion battery varies in capacity to obtain a capacity ratio of a positive electrode of said rechargeable lithium ion battery, a capacity ratio of a negative electrode of said rechargeable lithium ion battery, and a battery capacity fluctuation amount, and applying said capacity ratios respectively of said positive and negative electrodes that are obtained to a previously obtained correspondence between said capacity ratios respectively of said positive and negative electrodes and a first amount of said battery capacity fluctuation amount to separate said battery capacity fluctuation amount that is obtained into said first amount and a second amount of said battery capacity fluctuation amount, said first amount corresponding to degradation attributed to wear, said second amount corresponding to degradation attributed to deposition of lithium; and one of said battery parameter and said first parameter includes said second amount.

8. The value calculation method for a rechargeable battery according to claim 6, wherein:

said rechargeable battery is a rechargeable lithium ion battery;

the step of measuring before said rechargeable battery is re-restrained includes the steps of performing a degradation diagnosis based on an open circuit voltage characteristic of said rechargeable lithium ion battery indicating how said rechargeable lithium ion battery varies in open circuit voltage as said rechargeable lithium ion battery varies in capacity to obtain a capacity ratio of a positive electrode of said rechargeable lithium ion battery, a capacity ratio of a negative electrode of said rechargeable lithium ion battery, and a battery capacity fluctuation amount, and applying said capacity ratios respectively of said positive and negative electrodes that are obtained to a previously obtained correspondence between said capacity ratios respectively of said positive and negative electrodes and a first amount of said battery capacity fluctuation amount to separate said battery capacity fluctuation amount that is obtained into said first amount and a second amount of said battery capacity fluctuation amount, said first amount corresponding to degradation attributed to wear, said second amount corresponding to degradation attributed to deposition of lithium; and said second parameter includes said second amount.

9. The value calculation device for a rechargeable battery according to claim 2, wherein:

said rechargeable battery is a rechargeable lithium ion battery;

said first measurement unit includes a degradation parameter acquisition unit operative to perform a degradation diagnosis based on an open circuit voltage characteristic of said rechargeable lithium ion battery indicating how said rechargeable lithium ion battery varies in open circuit voltage as said rechargeable lithium ion battery varies in capacity to obtain a capacity ratio of a positive electrode of said rechargeable lithium ion battery, a capacity ratio of a negative electrode of said rechargeable lithium ion battery, and a battery capacity fluctuation amount, and a lithium deposition estimation unit operative to apply said capacity ratios respectively of said positive and negative electrodes that are obtained to a previously obtained correspondence between said capacity ratios respectively of said positive and negative electrodes and a first amount of said battery capacity fluctuation amount to separate said battery capacity fluctuation amount that is obtained into said first amount and a second amount of said battery capacity fluctuation amount, said first amount corresponding to degradation attributed to wear, said second amount corresponding to degradation attributed to deposition of lithium; and one of said battery parameter and said first parameter includes said second amount.

10. The value calculation method for a rechargeable battery according to claim 6, wherein:

said rechargeable battery is a rechargeable lithium ion battery;

the step of measuring after said rechargeable battery is re-restrained includes the steps of performing a degradation diagnosis based on an open circuit voltage characteristic of said rechargeable lithium ion battery indicating how said rechargeable lithium ion battery varies in open circuit voltage as said rechargeable lithium ion battery varies in capacity to obtain a capacity ratio of a positive electrode of said rechargeable lithium ion battery, a capacity ratio of a negative electrode of said rechargeable lithium ion battery, and a battery capacity fluctuation amount, and applying said capacity ratios respectively of said positive and negative electrodes that are obtained to a previously obtained correspondence between said capacity ratios respectively of said positive and negative electrodes and a first amount of said battery capacity fluctuation amount to separate said battery capacity fluctuation amount that is obtained into said first amount and a second amount of said battery capacity fluctuation amount, said first amount corresponding to degradation attributed to wear, said second amount corresponding to degradation attributed to deposition of lithium; and one of said battery parameter and said first parameter includes said second amount.

* * * * *